(12) United States Patent
Ward et al.

(10) Patent No.: US 8,044,388 B2
(45) Date of Patent: Oct. 25, 2011

(54) METHOD OF FORMING A CARBON NANOTUBE-BASED CONTACT TO SEMICONDUCTOR

(75) Inventors: Jonathan W. Ward, Fairfax, VA (US); Benjamin Schlatka, Boston, MA (US); Mitchell Meinhold, Arlington, MA (US); Robert F. Smith, Odessa, FL (US); Brent M. Segal, Woburn, MA (US)

(73) Assignee: Nantero, Inc., Woburn, MA (US)

( * ) Notice: Subject to any disclaimer, the term of this patent is extended or adjusted under 35 U.S.C. 154(b) by 0 days.

(21) Appl. No.: 12/506,878

(22) Filed: Jul. 21, 2009

(65) Prior Publication Data

US 2010/0148183 A1    Jun. 17, 2010

Related U.S. Application Data

(63) Continuation of application No. 11/708,929, filed on Feb. 21, 2007, now Pat. No. 7,563,711, which is a continuation-in-part of application No. 11/111,582, filed on Apr. 21, 2005, which is a continuation of application No. 10/776,573, filed on Feb. 11, 2004, now Pat. No. 6,942,921, which is a continuation of application No. 10/128,118, filed on Apr. 23, 2002, now Pat. No. 6,706,402, which is a continuation-in-part of application No. 09/915,095, filed on Jul. 25, 2001, now Pat. No. 6,574,130, and a continuation-in-part of application No. 09/915,173, filed on Jul. 25, 2001, now Pat. No. 6,643,165, and a continuation-in-part of application No. 09/915,093, filed on Jul. 25, 2001, now Pat. No. 6,919,592.

(60) Provisional application No. 60/775,461, filed on Feb. 21, 2006.

(51) Int. Cl.
*H01L 35/24*    (2006.01)

(52) U.S. Cl. ........ 257/40; 257/26; 257/164; 257/E29.03
(58) Field of Classification Search .................... 257/26, 257/40, 164
See application file for complete search history.

(56) References Cited

U.S. PATENT DOCUMENTS 4,979,149 A    12/1990    Popovic et al.
(Continued)

FOREIGN PATENT DOCUMENTS

WO    WO-0048195 A1    8/2000
(Continued)

OTHER PUBLICATIONS

Avouris, P., "Carbon nanotube electronics," Chemical Physics 281, 2002, pp. 429-445.
(Continued)

*Primary Examiner* — Wai-Sing Louie

(57) ABSTRACT

Manufacturers encounter limitations in forming low resistance ohmic electrical contact to semiconductor material P-type Gallium Nitride (p-GaN), commonly used in photonic applications, such that the contact is highly transparent to the light emission of the device. Carbon nanotubes (CNTs) can address this problem due to their combined metallic and semiconducting characteristics in conjunction with the fact that a fabric of CNTs has high optical transparency. The physical structure of the contact scheme is broken down into three components, a) the GaN, b) an interface material and c) the metallic conductor. The role of the interface material is to make suitable contact to both the GaN and the metal so that the GaN, in turn, will make good electrical contact to the metallic conductor that interfaces the device to external circuitry. A method of fabricating contact to GaN using CNTs and metal while maintaining protection of the GaN surface is provided.

13 Claims, 19 Drawing Sheets

1000

U.S. PATENT DOCUMENTS

| | | |
|---|---|---|
| 6,409,567 B1 | 6/2002 | Amey, Jr. et al. |
| 6,417,525 B1 | 7/2002 | Hata |
| 6,423,583 B1 | 7/2002 | Avouris et al. |
| 6,426,687 B1 | 7/2002 | Osborn |
| 6,443,901 B1 | 9/2002 | Fraser |
| 6,445,006 B1 * | 9/2002 | Brandes et al. ............. 257/76 |
| 6,504,292 B1 * | 1/2003 | Choi et al. ............. 313/310 |
| 6,548,841 B2 | 4/2003 | Frazier et al. |
| 6,574,130 B2 | 6/2003 | Segal et al. |
| 6,643,165 B2 | 11/2003 | Segal et al. |
| 6,784,028 B2 | 8/2004 | Rueckes et al. |
| 6,803,840 B2 | 10/2004 | Hunt et al. |
| 6,809,462 B2 | 10/2004 | Pelrine et al. |
| 6,835,591 B2 | 12/2004 | Rueckes et al. |
| 6,836,424 B2 | 12/2004 | Segal et al. |
| 6,891,320 B2 * | 5/2005 | Nakamoto ............. 313/311 |
| 6,911,682 B2 | 6/2005 | Rueckes et al. |
| 6,942,921 B2 | 9/2005 | Rueckes et al. |
| 6,955,937 B1 | 10/2005 | Burke et al. |
| 6,969,651 B1 | 11/2005 | Lu et al. |
| 6,975,189 B1 | 12/2005 | Reamon et al. |
| 6,979,590 B2 | 12/2005 | Rueckes et al. |
| 7,056,758 B2 | 6/2006 | Segal et al. |
| 7,120,047 B2 | 10/2006 | Segal et al. |
| 7,176,505 B2 | 2/2007 | Rueckes et al. |
| 7,264,990 B2 | 9/2007 | Rueckes et al. |
| 7,298,016 B2 | 11/2007 | Segal et al. |
| 7,304,357 B2 | 12/2007 | Jaiprakash et al. |
| 7,335,528 B2 | 2/2008 | Rueckes et al. |
| 7,342,818 B2 | 3/2008 | Segal et al. |
| 7,419,845 B2 | 9/2008 | Rueckes et al. |
| 7,566,478 B2 | 7/2009 | Ward et al. |
| 7,745,810 B2 | 6/2010 | Rueckes et al. |
| 2004/0031975 A1 | 2/2004 | Kern et al. |
| 2004/0181630 A1 | 9/2004 | Jaiprakash et al. |
| 2004/0232429 A1 | 11/2004 | Miki et al. |
| 2004/0238907 A1 | 12/2004 | Pinkerton et al. |
| 2005/0068128 A1 | 3/2005 | Yip |
| 2005/0191495 A1 | 9/2005 | Rueckes et al. |
| 2005/0199894 A1 | 9/2005 | Rinzler et al. |
| 2005/0218523 A1 | 10/2005 | Dubin |
| 2005/0230763 A1 | 10/2005 | Huang et al. |
| 2005/0266605 A1 | 12/2005 | Kawakami |
| 2006/0237537 A1 | 10/2006 | Empedocles et al. |

FOREIGN PATENT DOCUMENTS

| | | |
|---|---|---|
| WO | WO-0245113 A1 | 6/2002 |
| WO | WO-2005/083751 A1 | 8/2005 |
| WO | WO-2008/115652 | 9/2008 |

OTHER PUBLICATIONS

Bradley, K. et al., "Flexible Nanotube Electronics," Nano Letters 2003, vol. 3, No. 10, 1353-1355.

Dequesnes, et al., "Calculation of pull-in voltages for carbon-nanotube-based nanoelectromechanical switches," Nanotechnology 13, 2002, pp. 120-131.

Kahn, M.G.C. et al., "Solubilization of Oxidized Single-Walled Carbon Nanotubes in Organic and Aqueous Solvents through Organic Derivatization," Nano Letters 2002, vol. 2, No. 11, pp. 1215-1218.

Kaneto, K. et al., "Electrical conductivities of multi-wall carbon nano tubes," Synthetic Metals, Elsevier Science S.A. (1999), vol. 103, pp. 2543-2546.

International Search Report and Written Opinion of the International Searching Authority of the United States Patent and Trademark Office, dated Aug. 4, 2008, 7 pages.

Niu, C. et al., "High power electrochemical capacitors based on carbon nanotube electrodes," Appl. Phys. Lett 70 (11), Mar. 17, 1997, pp. 1480-1482.

Shelimov et al., "Purification of single-wall carbon nanotubes by ultrasonically assisted filtration," Chemical Physics Letters, vol. 282, pp. 429-434, Jan. 23, 1998.

Stadermann, M. et al., "Nanoscale study of conduction through carbon nanotube networks," *Phys. Rev. B 69* , 201402(R), 2004.

Lee, et al., "Single Wall Carbon Nanotubes for p-Type Ohmic Contacts to GAN Light-Emitting Diodes," Nano Letters, 2004, vol. 4, No. 5, pp. 911-915.

* cited by examiner

6000

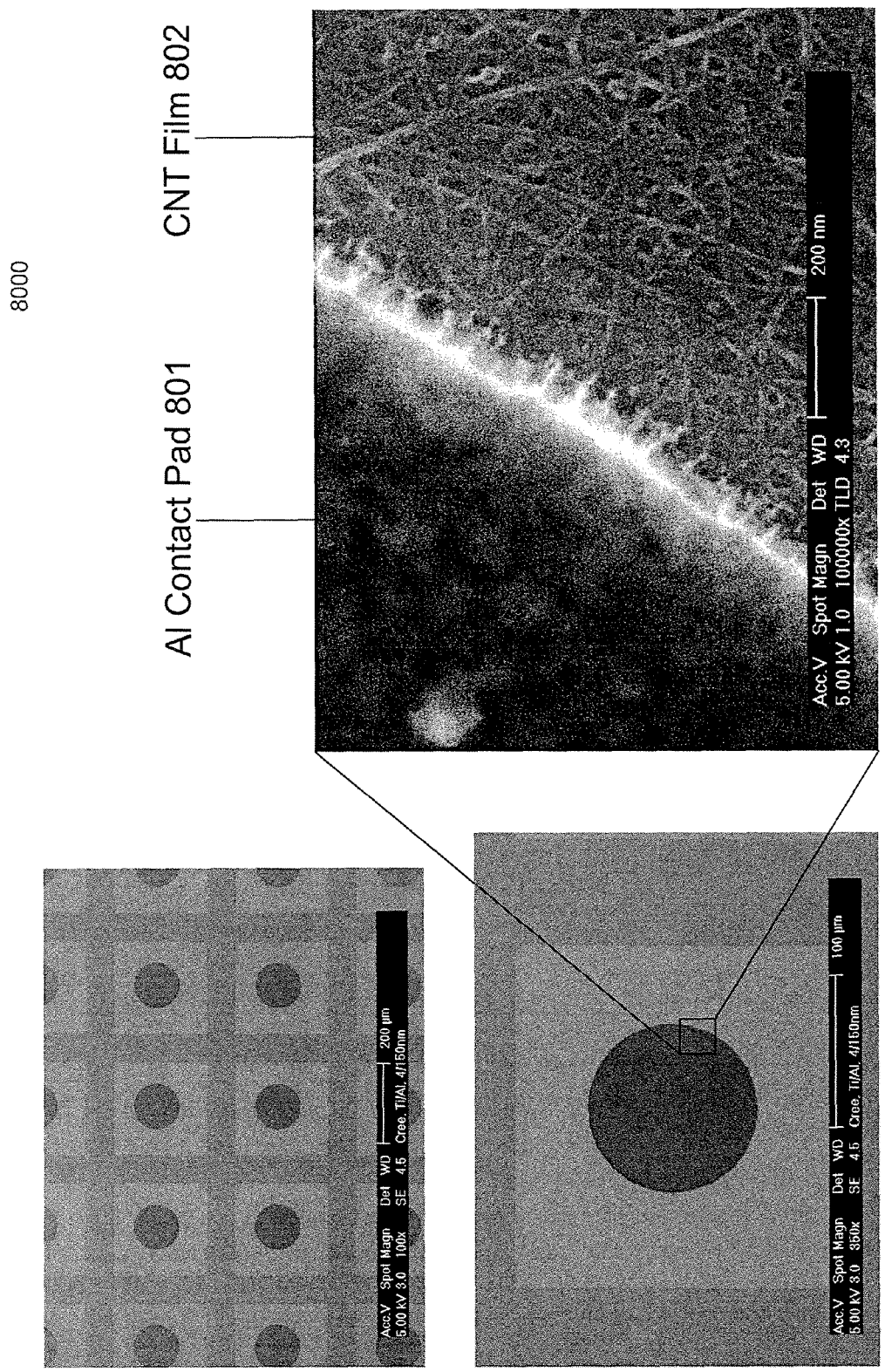
Figure 8 SEM images of CNT contacted p-GaN LED.

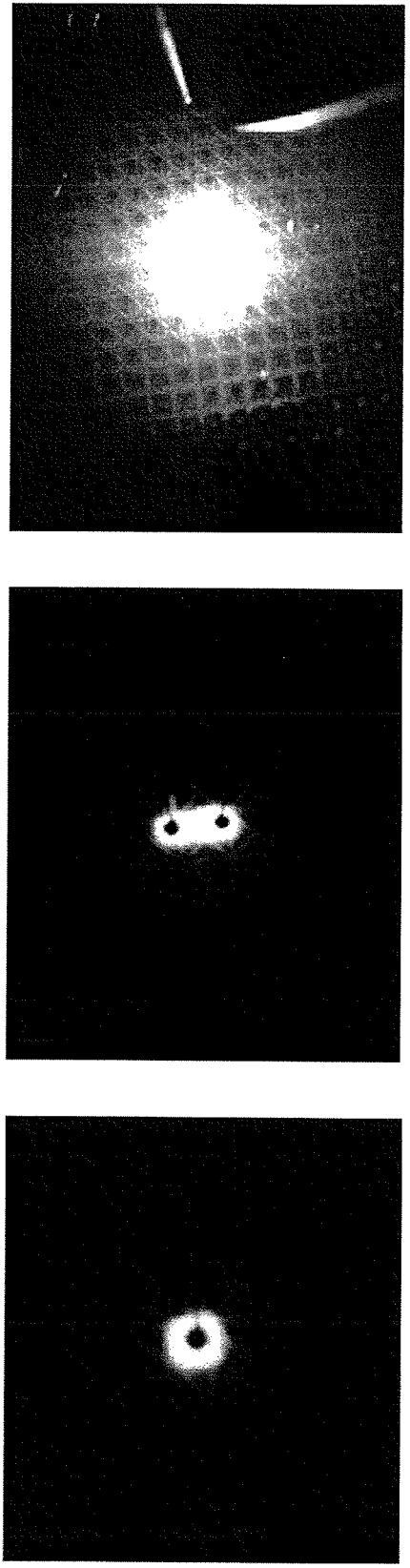
Figure 9  Microscope images of light emission from CNT-contacted p-GaN LED.

Figure 10 IV characteristic of CNT contacted p-GaN LED.
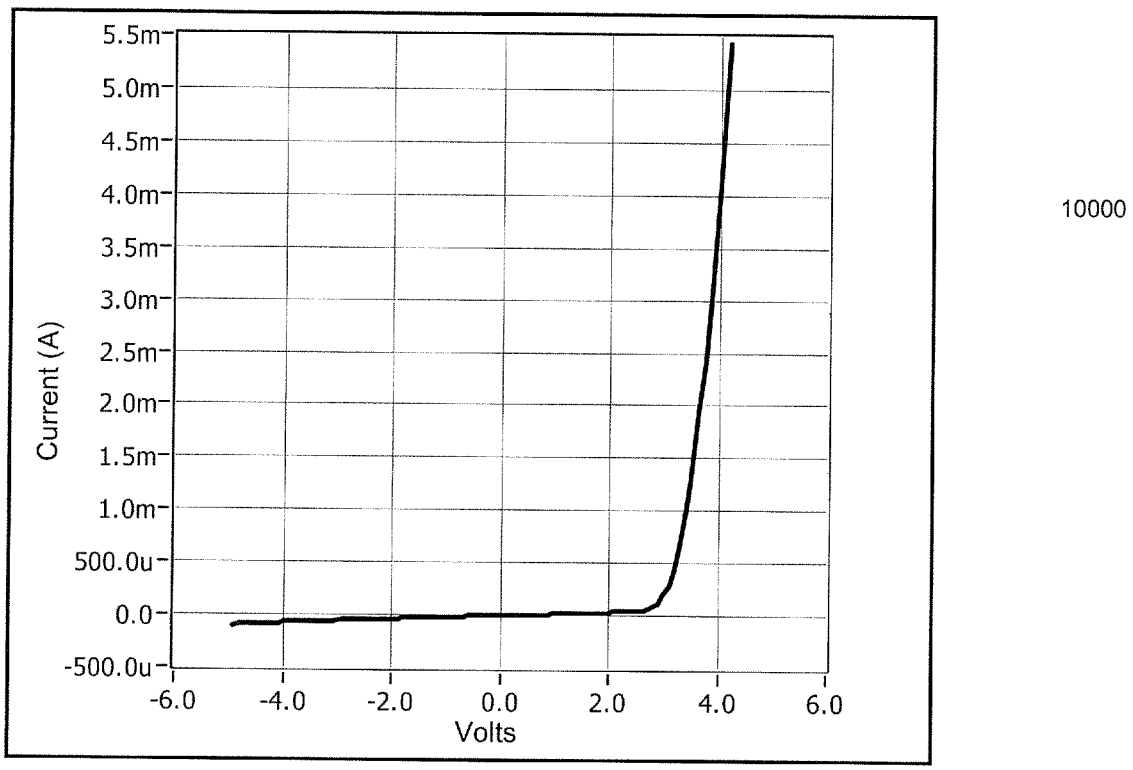
10000
Light emission at ~3V, 100uA in C4

METHOD OF FORMING A CARBON NANOTUBE-BASED CONTACT TO SEMICONDUCTOR

CROSS-REFERENCE TO RELATED APPLICATIONS

This application is a continuation of and claims priority under 35 U.S.C. §120 to U.S. patent application Ser. No. 11/708,929 filed Feb. 21, 2007, now U.S. Pat. No. 7,563,711 which is a continuation-in-part of and claims priority under 35 U.S.C. §120 to U.S. patent application Ser. No. 11/111,582, filed on Apr. 21, 2005, entitled NANOTUBE FILMS AND ARTICLES, which is a continuation of U.S. patent application Ser. No. 10/776,573, filed on Feb. 11, 2004, now U.S. Pat. No. 6,942,921, which is a continuation of U.S. patent application Ser. No. 10/128,118, filed Apr. 23, 2002, now U.S. Pat. No. 6,706,402, which is a continuation-in-part of and claims priority under 35 U.S.C. §120 to U.S. patent application Ser. No. 09/915,095, now U.S. Pat. No. 6,574,130, filed on Jul. 25, 2001, entitled HYBRID CIRCUIT HAVING NANOTUBE ELECTROMECHANICAL MEMORY, U.S. patent application Ser. No. 09/915,173, now U.S. Pat. No. 6,643,165, filed on Jul. 25, 2001, entitled ELECTROMECHANICAL MEMORY HAVING CELL SELECTION CIRCUITRY CONSTRUCTED WITH NANOTUBE TECHNOLOGY, and U.S. patent application Ser. No. 09/915,093, now U.S. Pat. No. 6,919,592, filed on Jul. 25, 2001, entitled ELECTROMECHANICAL MEMORY ARRAY USING NANOTUBE RIBBONS AND METHOD FOR MAKING SAME, and hereby incorporates such references in their entirety.

U.S. application Ser. No. 11/708,929 also claims priority under 35 U.S.C. §119(e) to U.S. Provisional Patent Application No. 60/775,461, filed on Feb. 21, 2006, entitled METHOD OF FORMING CARBON NANOTUBE-BASED CONTACT TO SEMICONDUCTOR which is incorporated herein by reference in its entirety.

BACKGROUND

1. Technical Field

The present application generally relates to methods of forming carbon nanotube-based contacts to semiconductors and more particularly to method of manufacturing carbon-nanotube based contacts to semiconductors for electronic and photonic applications.

2. Discussion of Related Art

III-V semiconductors, specifically GaN ($E_g \sim 3.37$ eV), are widely employed for optoelectronic and electronic devices. These materials have many advantages compared to silicon based technology. However, the lack of a stable oxide high manufacturing costs of the III-V semiconductors have prevented them from replacing silicon electronics beyond niche devices and optoelectronic devices (a substantial market itself).

Carbon nanotubes (CNTs) are a new material that is finding various uses especially in the nanoelectronics industry. CNTs contain a tubular structure with diameters ranging from 1-2 nm and have many unique and valuable properties such as dual metallic and semiconductor conduction, high mechanical strength (modulus around 1 TPa), excellent thermal and optical properties and chemical inertness/resilience.

A major challenge in the optoelectronics industry is the ability to form an ohmic, low contact resistance between a metallic (or conductive metal-oxides) thin film and the active p-GaN substrate, which has a very low conductivity. The metal contact must also have a high optical transmittance at the desired operation wavelength, which mandates the use of ultra-thin metal films (<50 nm). These thinner metal films may lead to current uniformity and current injection problems into the p-GaN. Therefore, a balance must be struck between the thin film sheet resistance, the thickness of the metal film and the metal film's optical transmittance. Ideally, a metal or conductive metal-oxide film should form an ohmic contact to the p-GaN, have a contact resistivity of $<10^{-3}$ Ohms-cm$^2$, have a sheet resistance of <100 Ohms per square, have an index of refraction >1.5 and have an optical transmission of >85% at the desired wavelength. Further complicating the development of GaN optical devices are the many issues with processing p-GaN; such as, sensitivity of the active region to photoresists, dry etching and some solvents.

Currently, a scalable, manufacturable process does not exist for making CNT-based contacts to p-GaN devices. For a process to be manufacturable, it should be useable with the tools and procedures employed in industry. The process outlined in this invention not only conforms to such guidelines, but results in encapsulation of the GaN surface during processing thereby maximizing the quality of the interface of the product.

The idea of using nanotubes to make contact to p-GaN has been published by Lee, K., at al. ("Single wall carbon nanotubes for p-type ohmic contacts to GaN light-emitting diodes", Nano Letters, 4(5), (2004), 911-914) and patented by Rinzler, A. G., et al, ("Semiconductor device and method using nanotube contacts" US Application number: US 20050199894 (2205)), which both use a thick layer of carbon nanotubes to make a low contact resistance contact to a GaN substrate that was able to transmit blue light centered around 434 nm. However, neither of these references present or purport to have implemented a process suitable in a manufacturing environment. More particularly, in both references, the type of nanotubes and the technique employed to deposit the fabric cannot be reproduced in a suitable manufacturing process. Both the publication by Lee, et. al, and the patent by Rinzler et. al report the use of metal lift-off, which will degrade the device characteristics since the active region is exposed to photoresist, basic developers and solvent chemistries, which damages the active region of the p-GaN, a very sensitive material. The present disclosure details techniques that avoids the abovementioned difficulties and provides new methods of making a desired contact besides using just a nanotube fabric.

SUMMARY OF THE INVENTION

This invention provides a method of forming low contact resistance interfaces between a semiconductor, a fabric of carbon nanotubes and a metal layer, while allowing for a high optical transmittance of the carbon nanotube fabric.

Under one aspect of the invention, a conductive article is provided. A semiconductor material substrate is provided and a patterned conductive trace is disposed on the semiconductor material substrate. The trace includes a non-woven nanotube fabric layer comprising a plurality of unaligned nanotubes providing a plurality of conductive pathways along the extent of the trace, and a metal layer adjacent to the non-woven nanotube fabric layer.

Under another aspect of the invention the metal layer is a thin film disposed on the non-woven nanotube fabric layer and is of generally planar extension and substantially parallel to the major surface of the semiconductor.

Under another aspect of the invention, the conductive article further comprises a metal electrode disposed over and in electrical communication with the metal layer.

Under another aspect of the invention, the non-woven nanotube fabric layer is disposed on the metal layer and the metal layer is a thin film of generally planar extension and substantially parallel to the major surface of the semiconductor.

Under another aspect of the invention, the conductive article further comprises a metal electrode disposed over and in electrical communication with the non-woven nanotube fabric.

Under another aspect of the invention, the conductive article further comprising multiple layers of metal and multiple layers of non-woven nanotube fabric, alternately disposed.

Under another aspect of the invention, each layer of metal and each layer of non-woven nanotube fabric is of generally planar extension and substantially parallel to the major surface of the semiconductor.

According to another aspect of the invention, at least a portion of the patterned conductive trace includes an active region that is constructed and arranged to be substantially optically transparent in at least a portion of the visible light range.

According to another aspect of the invention, the metal layer is a thin film of less than 10 nanometers thickness in the dimension substantially perpendicular to the major surface of the semiconductor.

According to another aspect of the invention, the semiconductor includes a p-GaN layer and a n-GaN layer disposed in adjacent and substantially parallel layers.

According to another aspect of the invention, the semiconductor material substrate is selected from a set including Group III-V, V and II-VI semiconductor materials.

According to another aspect of the invention, the non-woven nanotube fabric includes single-walled carbon nanotubes and multi-walled carbon nanotubes.

According to another aspect of the invention, the non-woven nanotube fabric includes metallic nanotubes and semiconducting nanotubes and the relative composition of metallic and semiconducting nanotubes in the fabric is controlled.

Under another aspect of the invention, a light-emitting semiconductor device is provided. The light-emitting semiconductor device includes a semiconductor material substrate and a metal contact in electrical communication with the semiconductor. The light-emitting semiconductor device also includes an interface structure comprising a nonwoven nanotube fabric layer and a metal layer, such that the interface structure is interposed between the metal contact and the semiconductor, electrically couples the metal contact to the semiconductor, and includes at least one active region, adjacent to said metal contact, that is at least partially optically transparent in at least a portion of the visible light range.

Under another aspect of the invention, the interface structure is constructed and arranged to provide a low resistance electrical pathway between the semiconductor and the metal contact.

Under another aspect of the invention, the metal layer of the interface structure is selected and arranged to provide an ohmic contact to the layer of non-woven nanotube fabric and to the metal contact.

According to another aspect of the invention, a method of making a conductive article on a semiconductor is provided. The method of making a conductive article on a semiconductor includes providing a semiconductor, forming on the semiconductor a conductive trace including a nonwoven nanotube fabric layer and a thin metal layer, and depositing a mask layer over the conductive trace. The method of making a conductive article on a semiconductor also includes defining a pattern in the mask layer, the pattern corresponding to the shape of the article, and removing portions of the nanotube fabric layer and portions of the metal layer in accordance with the pattern of the mask layer so that the remaining conductive trace forms the conductive article and the semiconductor is substantially preserved.

According to another aspect of the invention, forming a nonwoven nanotube fabric layer includes applying carbon nanotubes via at least one of spincoating and spraycoating operations.

According to another aspect of the invention, removing portions of the nanotube fabric and portions of the thin metal layer in accordance with the pattern of the mask layer includes at least one of wet etching and dry etching operations.

According to another aspect of the invention, forming a metal contact on the conductive trace wherein the metal contact is in electrical communication with the semiconductor.

According to another aspect of the invention, forming a metal contact includes at least one of wet etching and reactive ion etching operations.

According to another aspect of the invention, the thin metal layer of the conductive trace is constructed and arranged to provide a low resistance contact to the layer of non-woven nanotube fabric and to the metal contact.

According to another aspect of the invention, forming a conductive trace includes disposing the thin metal layer on the nanotube fabric layer.

According to another aspect of the invention, forming a conductive trace includes disposing the nanotube fabric layer on thin metal layer.

According to another aspect of the invention, forming a conductive trace further includes providing multiple layers of carbon nanotube fabric and multiple thin layers of metal, alternately disposed.

BRIEF DESCRIPTION OF DRAWINGS

The foregoing and other objects of this invention, the various features thereof, as well as the invention itself, may be more fully understood from the following description when read together with the accompanying drawings in which:

FIG. 8 shows images of an embodiment of the invention in which carbon nanotubes contact an Aluminum pad in a p-GaN LED device.

FIG. 9 shows microscopic images of the light output from devices such as that depicted in FIG. 8.

FIG. 10 shows an I-V trace of the carbon nanotube-contacted p-GaN device depicted in FIG. 8.

DETAILED DESCRIPTION

Figure 1:
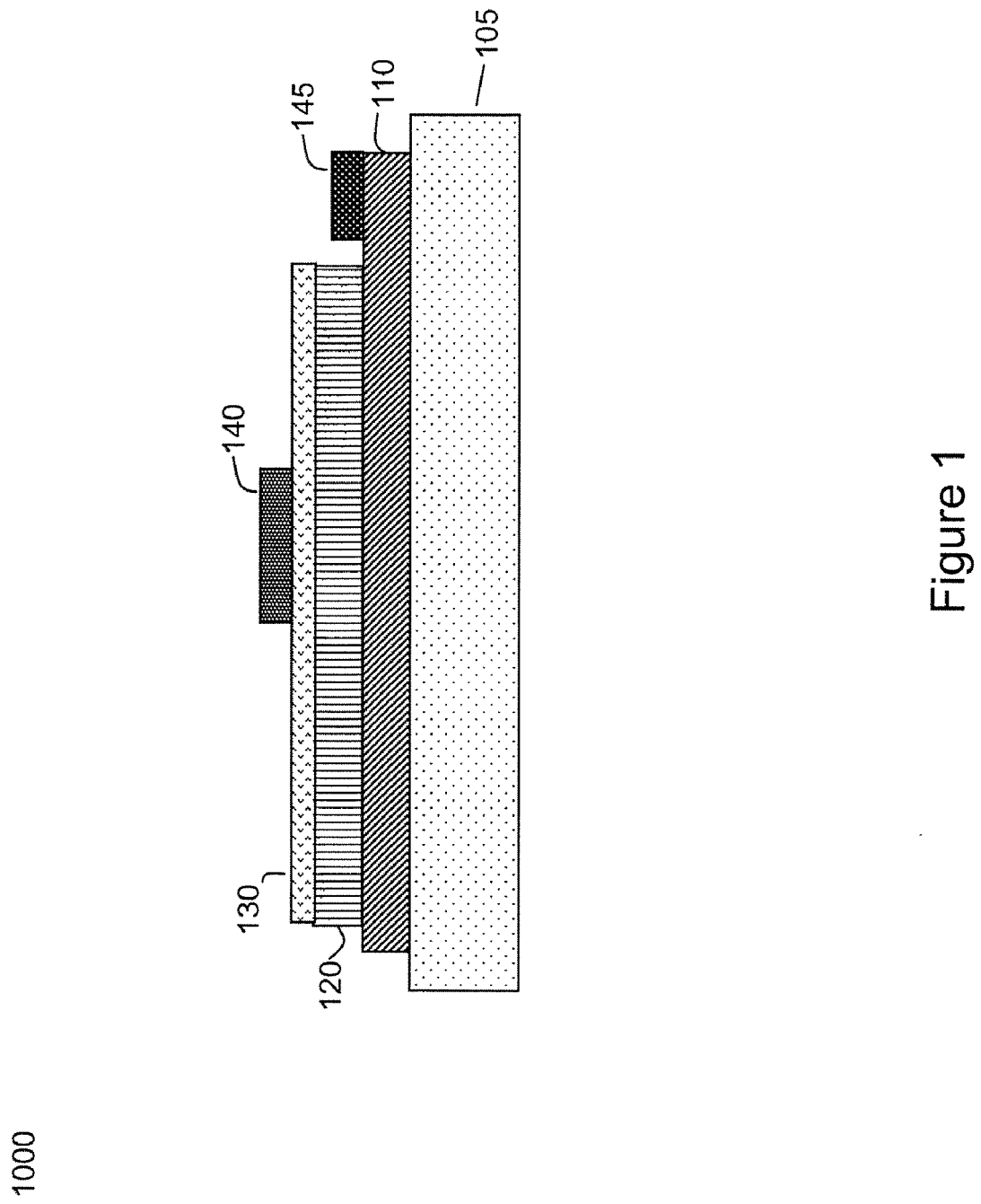
FIG. 1 is a representation of a conventional GaN LED with metal contact to p-GaN substrate.

P-type Gallium Nitride (p-GaN) is a semiconductor material used in applications such as light emitting diodes (LEDs). Currently, manufacturers encounter limitations in forming low resistance ohmic electrical contact to p-GaN such that the contact is highly transparent to the light emission of the device. It has been demonstrated that carbon nanotubes (CNTs) can address this problem due to their combined metallic and semiconducting characteristics in conjunction with the fact that a fabric of CNTs (CNTs dispersed on a surface) has excellent transparency. The physical structure of the contact scheme is broken down into three components, a) the GaN, b) an interface material and c) the metallic conductor. The metallic conductor interfaces the device to external circuitry. The role of the interface material is to make suitable contact to both the GaN and the metal so that the GaN, in turn, will make sufficient electrical contact to the external circuitry. As an additional fabrication constraint, the GaN surface is sensitive to various chemistries and should remain protected during the manufacturing process. A method of fabricating contact to GaN using CNTs and metal while maintaining protection of the GaN surface is provided. A CNT-based interface film can have high optical transparency while simultaneously forming good electrical contact. This characteristic makes this contact useful for photonic applications. Another benefit of a CNT-based contact is that CNT contacts are expected to be more durable during high temperature operation.

Aspects of the present invention regard manufacturing technique and integration of p-GaN. Because p-GaN is generally a very difficult material to integrate, using spinning techniques to provide nanotubes and depositing metal contacts is challenging. Certain techniques well-known in the relevant art are incompatible: p-GaN cannot be exposed to photoresist and solvents and any RIE processing of the active area will destroy the device. The present invention includes techniques that were developed to overcome these challenges.

Other key aspects of the present invention concern the type of metal contact provided. For example, in certain multilayered embodiments the use of CNT-metal-CNT-metal structures lowers the contact resistance and improves the current spread. In yet other embodiments a CNT fabric and a thin Pt layer, which is typically non-conductive, is used to both lower the resistance of the active contact region, improve current spreading, while maintaining the high transmission of the contacts Carbon Nanotube Films, Layers, Fabrics, and Articles The growth, deposition, patterning, and etching operations of carbon nanotube films, layers, fabrics and articles may use conventional techniques, such as lithographic patterning. Methods for forming carbon nanotube films, layers fabrics and articles on various surfaces and methods for then providing other materials over carbon nanotube surfaces are described in detail in U.S. Pat. No. 6,706,402 and U.S. Pat. No. 6,835,591, the entire contents of which are both herein incorporated by reference.

Conventional interconnect technologies have a tendency to suffer from thermal damage and metal diffusion eroding the performance of the semiconductor devices especially from degradation of the electrical properties. These effects become even more pronounced with size reduction in current generation 0.18 um and 0.13 um structures, e.g. by metal diffusion through ultra-thin gate oxide layers. In contrast, carbon nanotube ribbons are not beset with these problems. They are substantially more robust having the highest known thermal conductivities and are not prone to thermal failure. Furthermore, no metal or dopant diffusion can occur since they are constructed entirely of covalently bound carbon atoms.

Approaches for forming intermediate structures are described in detail in U.S. Pat. No. 6,706,402. In certain embodiments, a silicon substrate having a silicon dioxide layer receives a patterned photoresist layer. For example, a photoresist layer may be spin-coated on layer and subsequently exposed and lithographically developed yielding cavities and a mask pattern.

Afterwards, n-doped silicon or metal such as molybdenum, tungsten or tantalum and a sacrificial layer such as aluminum oxide may be deposited in the cavities.

A photoresist, material and aluminum oxide (Al2O3) on top of the photoresist may then be stripped away to form an intermediate structure with electrodes and sacrificial layer. A spin-on-glass (SOG) such as flowable oxide (FOX) is spin-coated over the structure and annealed using a ramped temperature protocol using standard techniques forming a SiO2 layer above the top of the sacrificial layer.

Reactive ion etching (RIE) or the like may then be used to etch the SiO2 layer to form a structure with supports.

The choice of electrode material is limited by the method by which the nanotubes are placed upon the substrate surface.

In the event that nanotubes are deposited on a surface at room temperature by spin-coating of a solution or suspension of nanotubes then the choice of electrode materials is expanded substantially. In this case there is no high temperature step and any metal typically compatible with standard CMOS metallization conditions would be acceptable especially, aluminum, and alloys thereof.

A sacrificial layer can be constructed of Al2O3, metal oxides, metals and other materials. An intermediate structure can be formed using a variety of materials to form supports including SOG, SiO2 and others. In the event that a low temperature spin-coating of nanotube protocol is chosen the materials suitable to be sacrificial layers expands substantially. This could include materials such as PMMA or other polymers, metals such tungsten, chromium, aluminum, bismuth and other transition and main group metals. Also other semiconductors such as germanium and insulators such as oxides and other chalcogenides may be used.

The choice of materials for the support layer greatly depends upon the method chosen for nanotube growth and other factors. In the even that a low-temperature process is chosen for placing nanotubes on the surface, one can envision utilizing such materials as Al2O3, silicon monoxide, semiconductors, insulators and polymers such as polyimide.

The materials selection process is confined to those materials that are compatible with the fabrication process described above. It is understood by those sufficiently skilled in the art that upon selection of a particular electrode material, the sacrificial layer and support materials naturally become limited based upon typical processing steps available in semiconductor fabrication. Likewise if a particular sacrificial layer is chosen the choices of electrode and sacrificial layer materials is suitably limited. Furthermore, upon selection of a particular support material it follows that the electrode and sacrificial layer materials choice is likewise limited.

Under certain embodiments, the nanotube ribbons may be held in position at the supports by friction. In other embodiments the ribbon may be held by other means, such as by anchoring the ribbons to the supports using any of a variety of techniques. This friction can be increased through the use of chemical interactions including covalent bonding through the use of carbon compounds such as pyrenes or other chemically reactive species. Evaporated or spin-coated material such as metals, semiconductors or insulators especially silicon, titanium, silicon oxide or polyimide could also be added to increase the pinning strength.

Carbon Nanotube-Based Contact to Semiconductor

In the present disclosure, the terms "interface material" and "interface film" are used interchangeably.

The present invention includes a method of forming a low contact resistance and high optical transparent film of carbon nanotubes on top of p-GaN. FIG. 1 shows a conventional simple discrete GaN LED structure 1000. This simple structure involves the use of a suitable substrate 105 such as sapphire, SiC, AlN, etc. that has n-type GaN layer 110 deposited on top. N-GaN is electrically contacted by metal 145. P-type GaN 120 is further deposited on top of n-GaN 110, making the p-n junction required for proper LED operation. Semi-transparent thin metal or metal oxide film 130 is deposited on top of p-GaN 120 to provide an ohmic low resistance contact for current injection into the active region of the p-GaN. Typical metals employed are Pt, Pd, TiAu, NiAu, Indium-Tin-Oxide (ITO), Zinc-Oxide, etc. Bond pad metal 140 is then contacted to semi-transparent film 130 to make electrical contact to appropriate interface electronics (not shown).

Figure 2A:
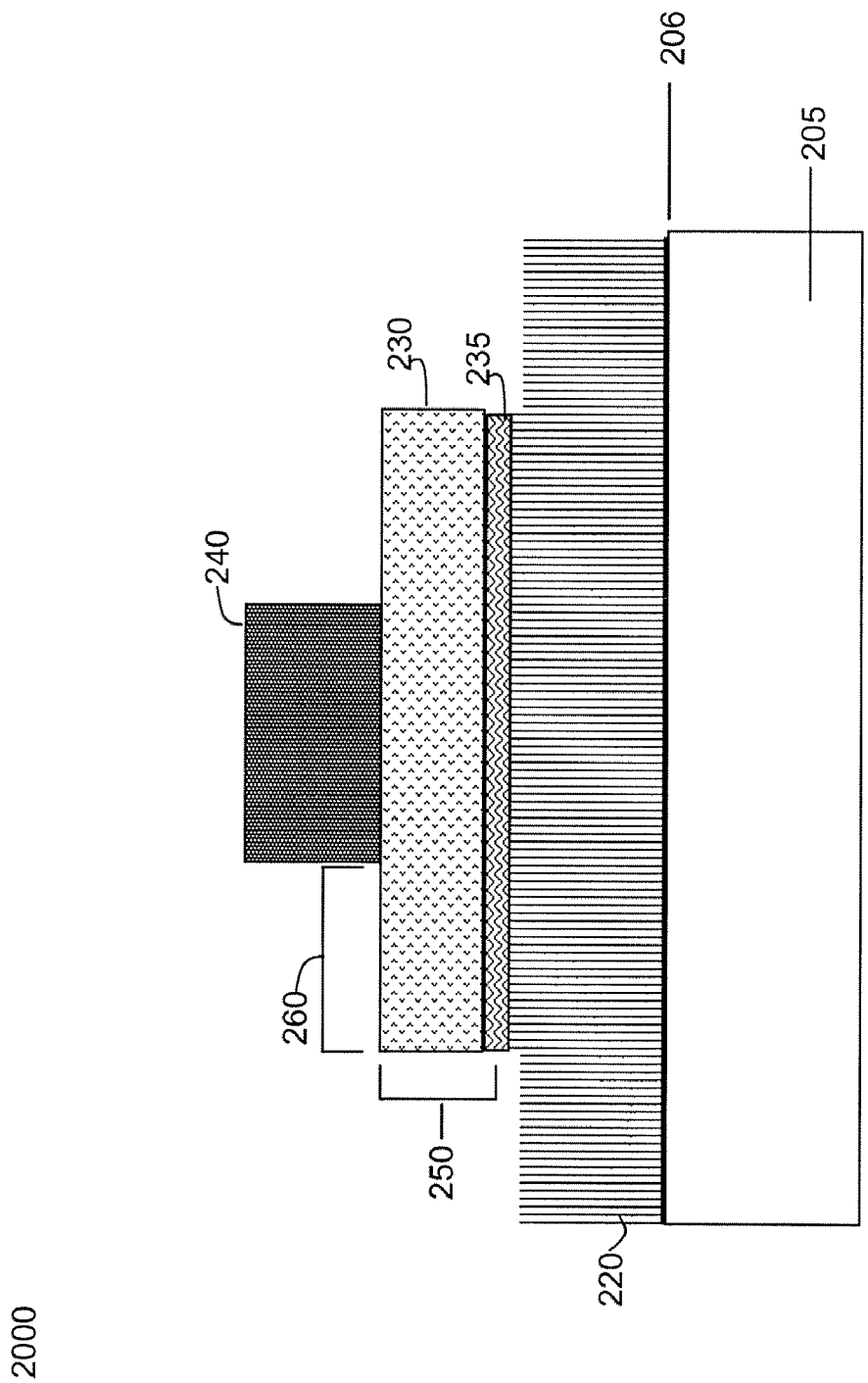
FIGS. 2A-C show cross-section views of an embodiment of CNT-based contact scheme to semiconductor in which CNTs.

FIG. 2A shows a cross-section diagram 2000 of the basic contact scheme using carbon nanotubes as the interfacial material. The substrate 205 may be sapphire, SiC, AlN or another material that is applicable for GaN technology with an additional film of semiconducting material 206 such as n-GaN. P-GaN 220 is deposited on top of substrate 205. As is well known in the art, the additional film of semiconducting material 206 such as n-GaN forms a p-n junction with overlying p-GaN 220 material. For illustrative purposes in the ensuing figures, substrate 205 should be understood to include overlying film of semiconducting material 206 like n-GaN. In this embodiment, a fabric of CNTs 235 and metal 230 are contacting the p-GaN 220 with the CNTs interposed between the metal 230 and p-GaN 220. Because the fabric of CNTs may be porous, both the metal and CNTs may be in contact with the p-GaN. In this embodiment, the metal 230 and CNTs 235 comprise what is termed as the interface film 250. The upper surface of the interface film is contacted by a metal bond pad 240. An active region 260 is adjacent to the metal pad 240.

Figure 2B:
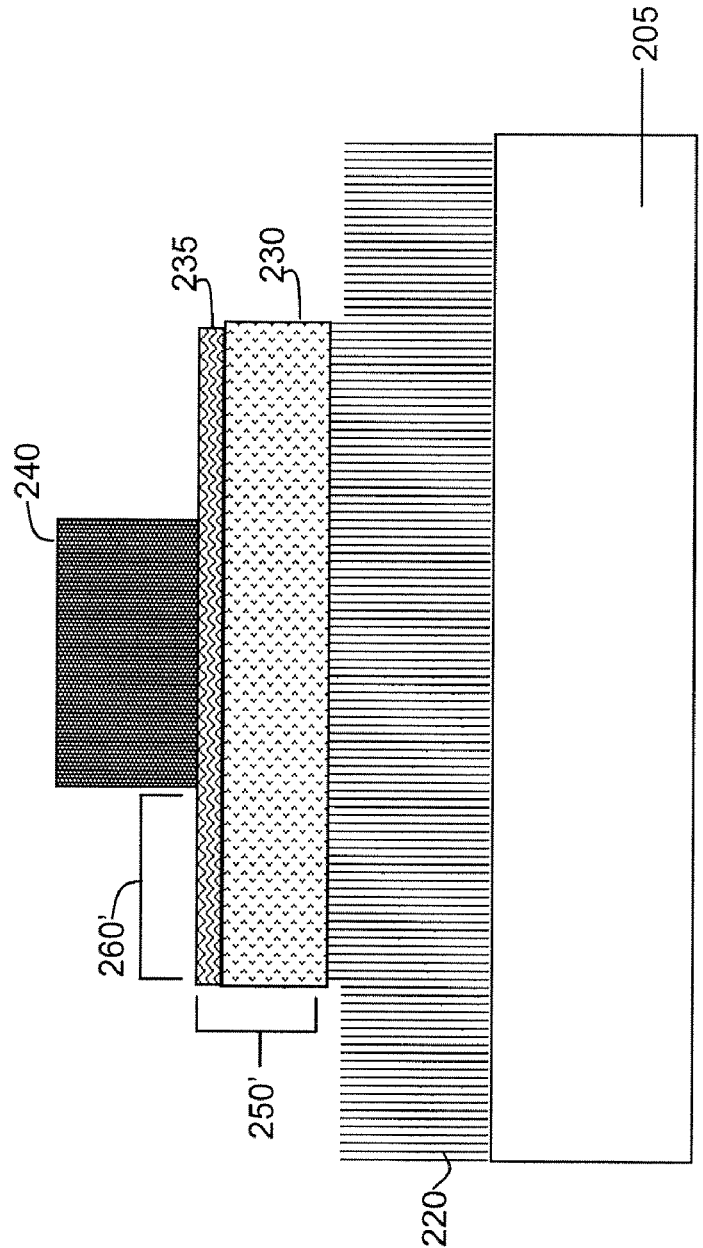

FIG. 2B shows an embodiment structure 2001 which is similar to structure 200; however, the interface film may have CNTs 235 on top of the metal 230, making interface contact structure 250'. In this case, the metal is in intimate contact with the p-GaN. In this case, the primary role of the CNTs is to provide a transparent conductive film to enhance spreading current while inducing a minimal impact on optical transparency. The CNTs, however, could assist in forming contact to the GaN if the metal 230 is sufficiently thin. A sufficiently thin metal may be 0.5 to 3 nm, for example. An active region 260' is adjacent to the metal pad 240.

Figure 2C:
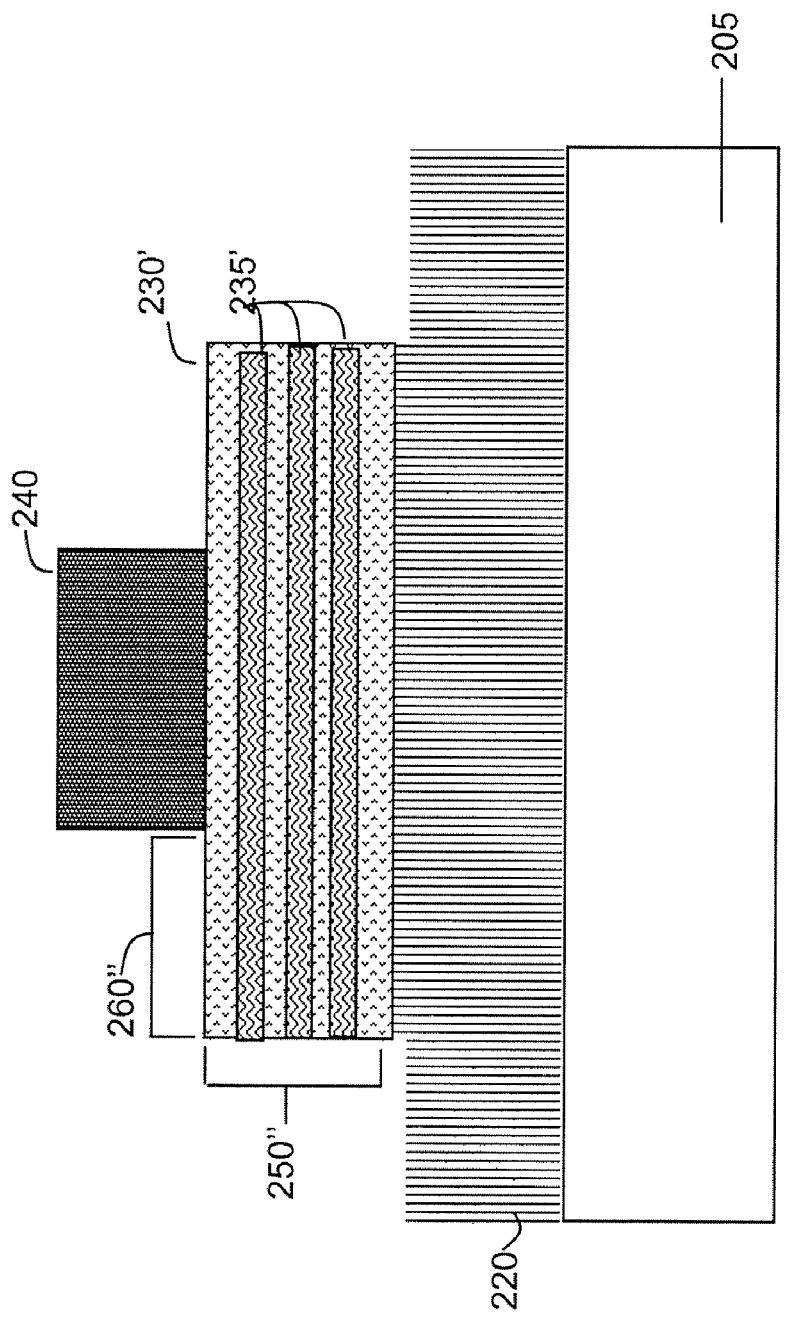

In another embodiment (FIG. 2C, showing structure 2002), the interface layer 250" consists of multiple layers of CNT 235' and metal 230'. For example, the sequence of films may be: CNT-metal-CNT. A second example is: CNT-metal-CNT-metal. A third example is: metal-CNT-metal. In the active region 260" adjacent to the metal pad 240, the metal portion of the interface film may be etched away leaving primarily CNTs. Methods used to provide an active region in single layer embodiments are also employed in multilayered embodiments. In preferred multilayered embodiments, the metal is etched before the nanotube fabric—because the CNT fabric is porous, the etchant will readily etch the multiple layers of metal—whether wet or dry. The CNT fabric can then be removed with a standard $O_2$ RIE to achieve the desired structure.

The above embodiment portrays one variant of the interface layer labeled as 250 (also 250' and 250") in FIG. 2A-C. As stated, the primary role of the interface layer is to provide good contact to the metal pad, good contact to the GaN and in some applications, allow for high optical transparency in the active contact region 260 (also 260' and 260") adjacent to the metal pad.

The role of the metal component of the interface layer may be as an etch-stop (for either RIE etch or wet etch) to define the metal pad 240 in FIG. 2A-C. An additional role of the metal may be to protect the CNTs from the device environment or from potentially damaging processing steps.

Figure 3A:
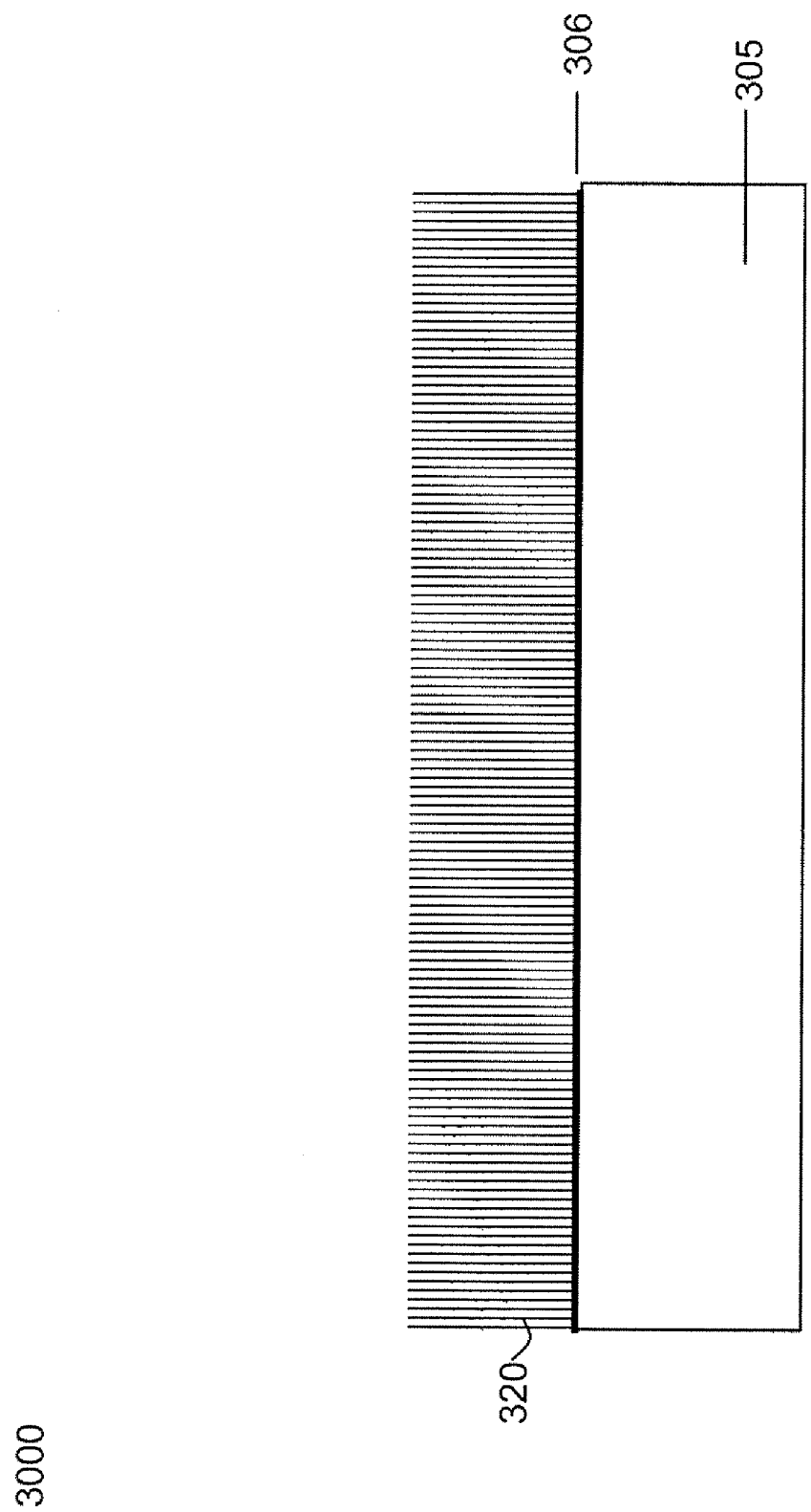
FIGS. 3A-H show cross-section views of the process involved with constructing a GaN device using a patterned CNT fabric as a contact region.

A primary effect of the CNTs at the interface layer is to provide enhanced contact to the GaN and/or to aid in conductance of the interface layer while maintaining high optical transparency. FIGS. 3A-H displays a method of forming a high transmittance and low resistance contact to p-GaN by employing a CNT fabric as an interfacial layer. The steps for forming such a structure are listed below. Referring to FIG. 3A, substrate 305, like substrate 205, includes an additional overlying film of semiconducting material 306 such as n-GaN, on which a p-GaN film 320 is deposited. For illustrative purposes in the ensuing figures, substrate 305 will be understood to include additional overlying film of semiconducting material 306. The use of semiconducting material 306 to form a p-n junction is well known in the art and will not be shown in the various embodiments that follow.

Step 1: The process starting point is shown in FIG. 3A (structure 3000) depicting a substrate 305, which is similar to substrate 205 presented in FIG. 2A-C. The p-GaN surface may be cleaned with an acid treatment (HF for example) prior to deposition of the CNTs to remove any protective oxides or other thin films.

Figure 3B:
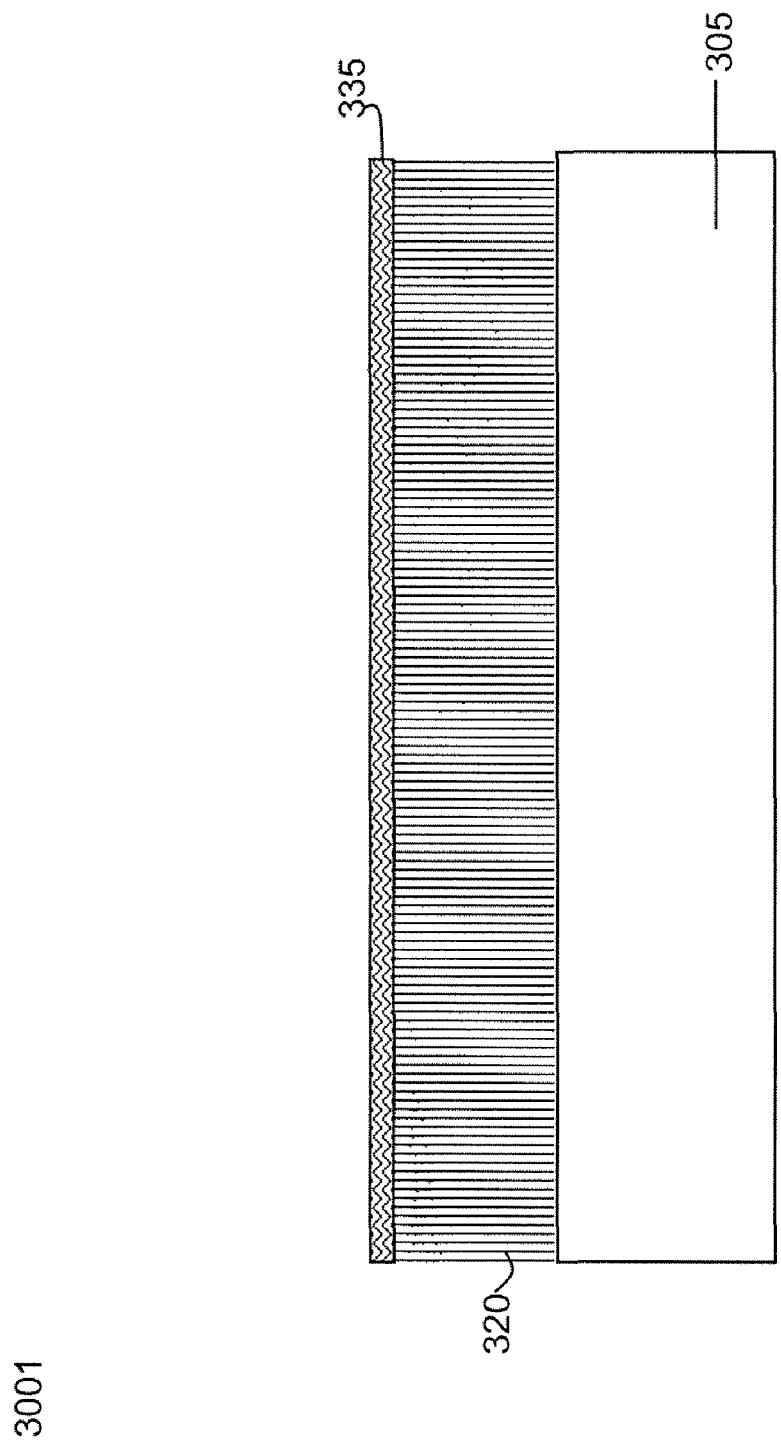

Step 2: FIG. 3B (3001) shows the substrate 305 and p-GaN film 320 with the first component of the interface structure deposited—the CNT fabric 335. The CNTs may be deposited by spin-coating or spray-coating techniques, well known in the art.

Figure 3C:
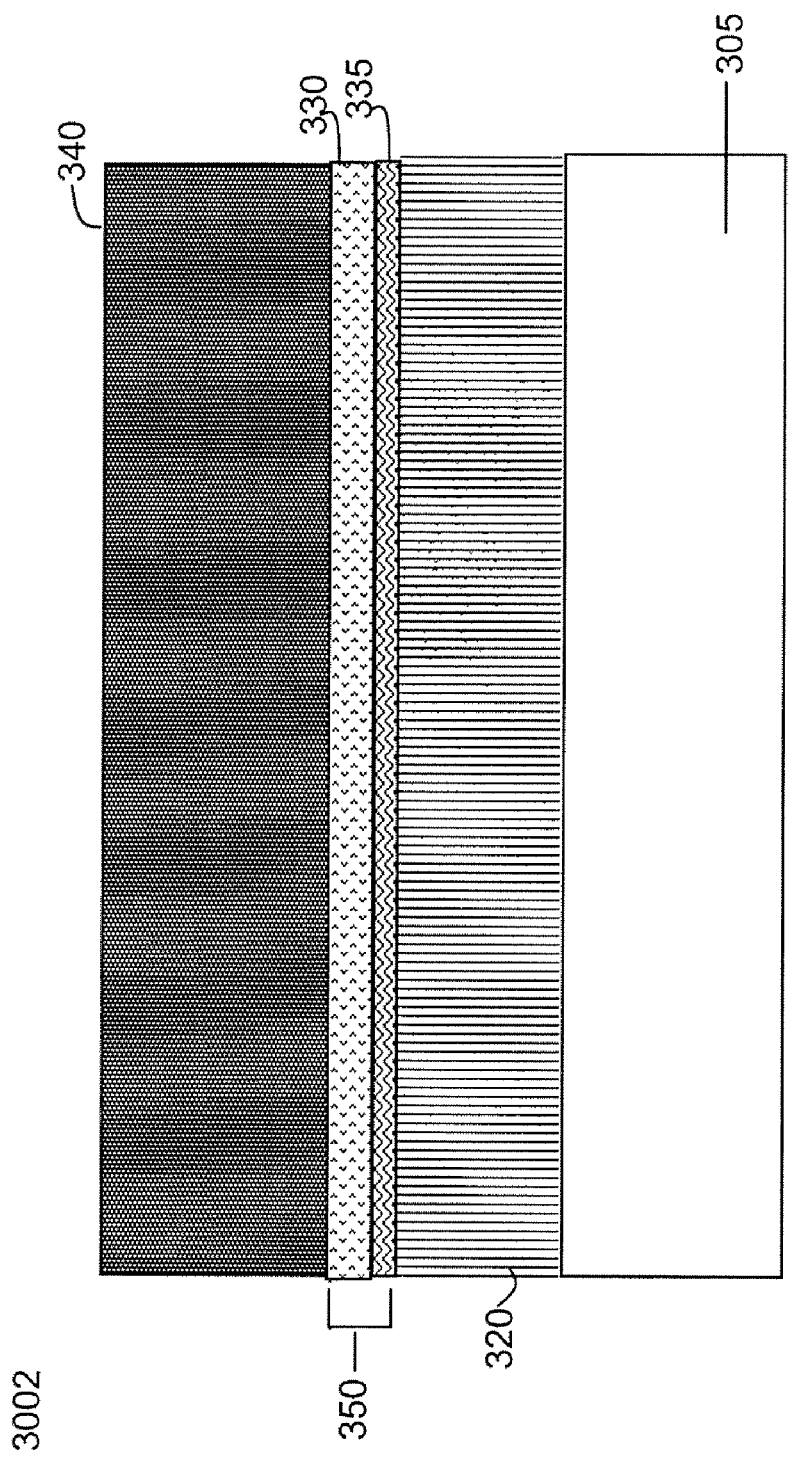

Step 3: FIG. 3C (3002) depicts the application of an additional component of the interface structure 350 which is the metal film 330. The metal contact/pad material 340 is then deposited on top of the interface structure 350.

Figure 3D:
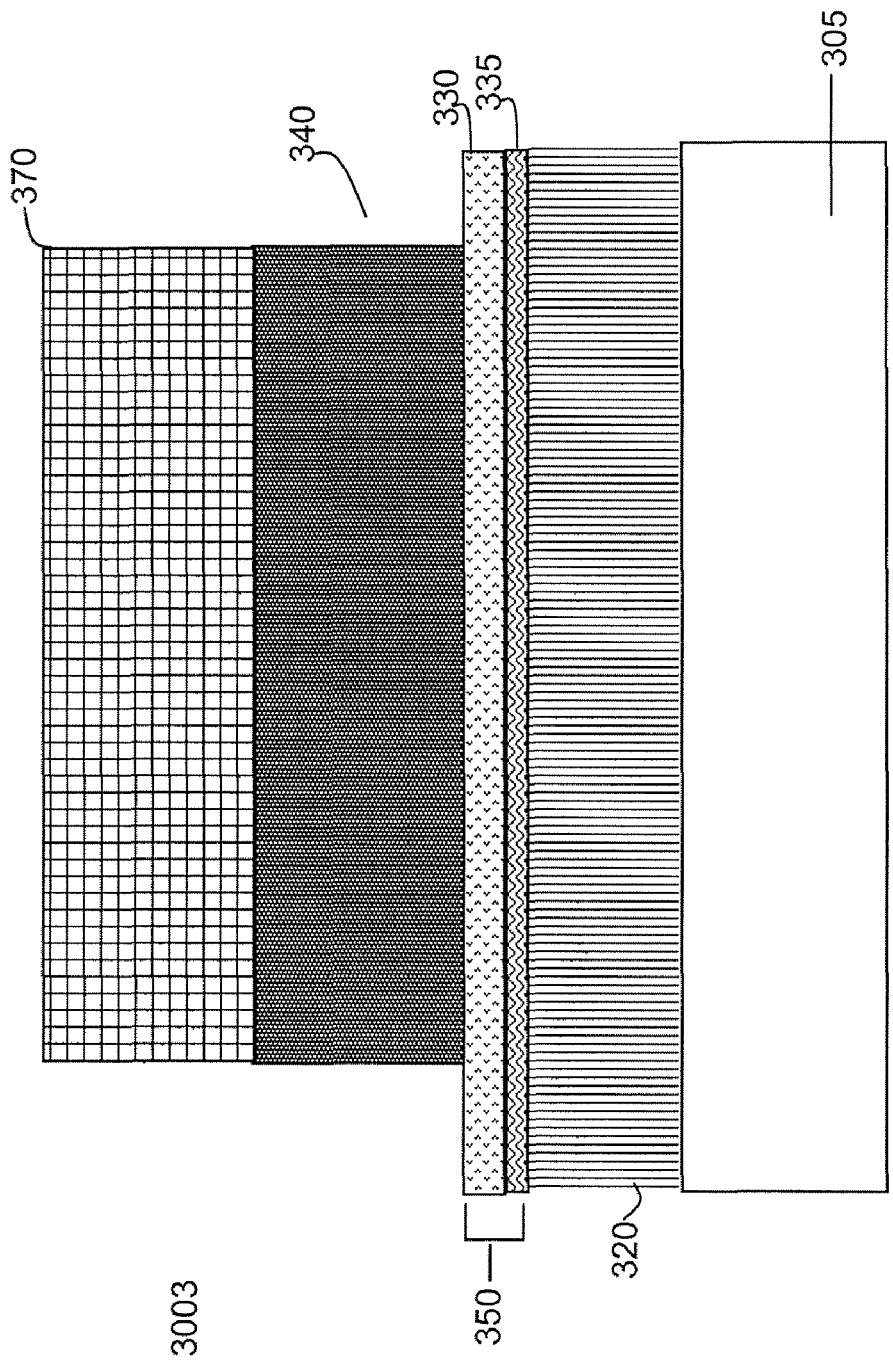
Figure 3E:
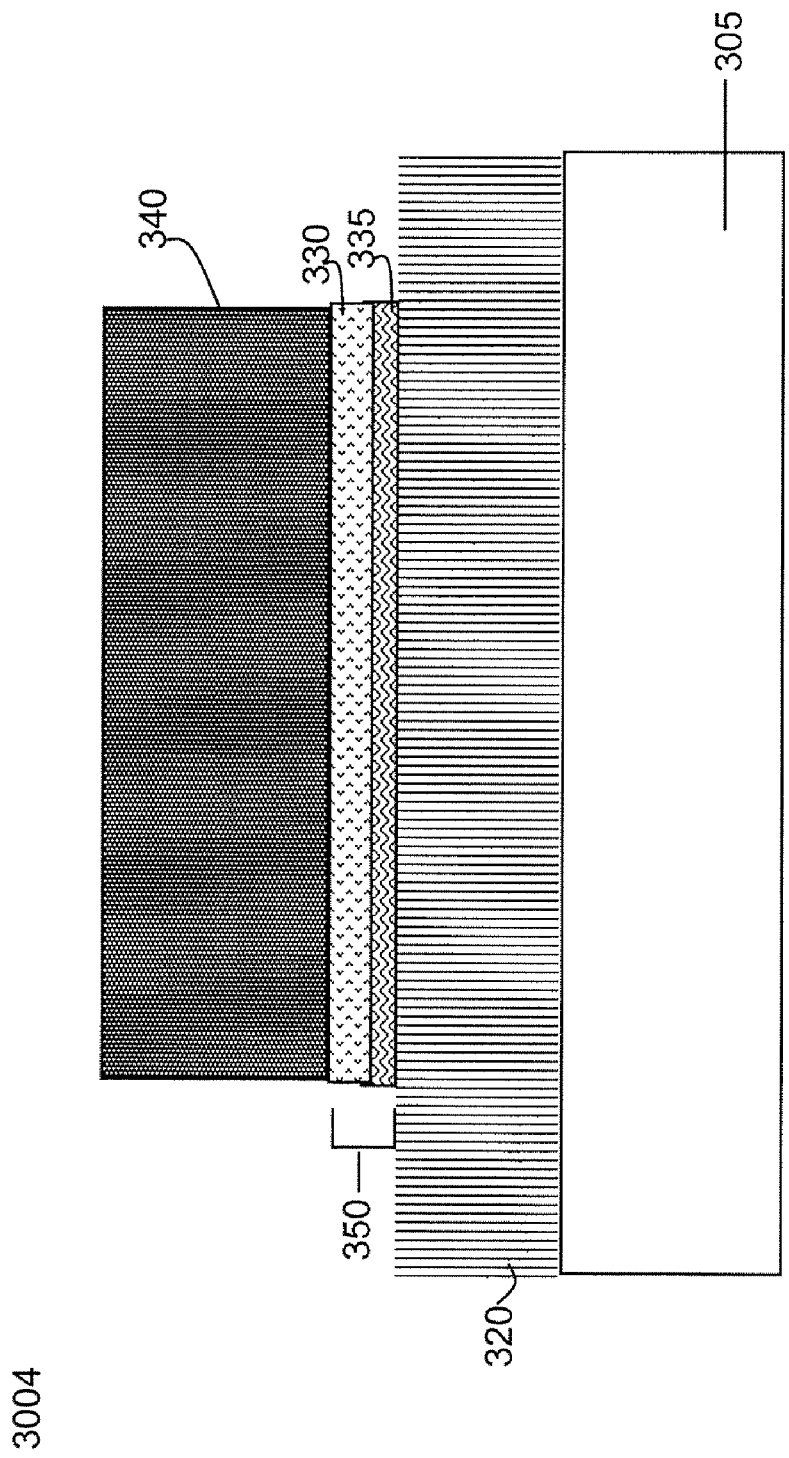

Step 4: FIG. 3D (3003) depicts the formation of the active area. Photoresist 370 is patterned on the bond pad metal layer 340. The resist pattern is then transferred into the pad metal 340 either by a wet etch process or a reactive ion etch (RIE) process. This pattern defines the electrically active contact area of the GaN LED structure.

Figure 3F:
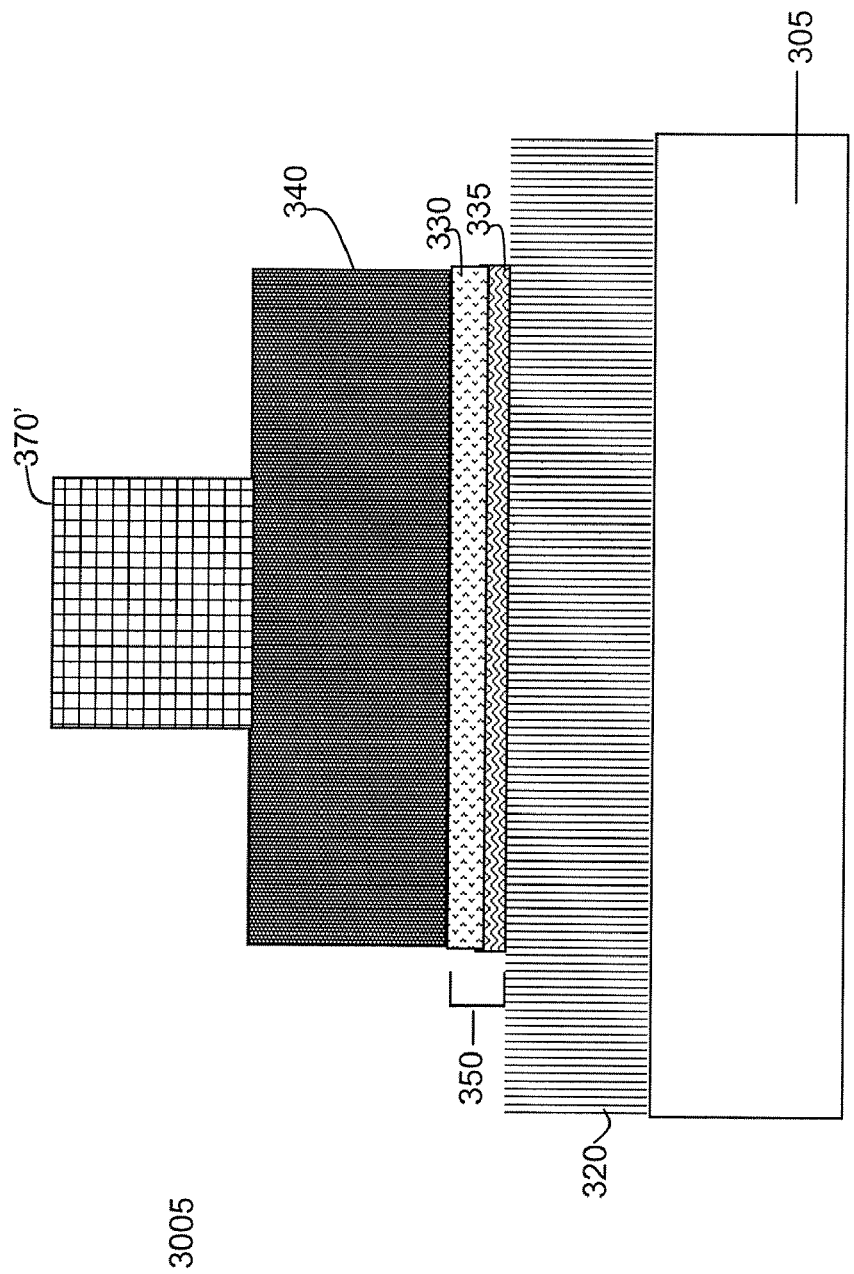

Step 5: The pattern of structure 3003 is transferred to the interface layer 350 by either wet etching or dry etching metal 330 and then dry etching CNT fabric 335, forming structure 3004, depicted in FIG. 3E. The dry etching processing of CNT fabric 335 has been previously described in U.S. patent application Ser. No. 09/915,093, filed on Jul. 25, 2001, now U.S. Pat. No. 6,919,592, entitled ELECTROMECHANICAL MEMORY ARRAY USING NANOTUBE RIBBONS AND METHOD FOR MAKING SAME; U.S. patent application Ser. No. 10/850,100, filed on May 20, 2004, now U.S. Pat. No. 7,056,758, entitled ELECTROMECHANICAL MEMORY ARRAY USING NANOTUBE RIBBONS AND METHOD FOR MAKING SAME; U.S. patent application Ser. No. 10/852,880, filed on May 25, 2004, entitled ELECTROMECHANICAL MEMORY ARRAY USING NANOTUBE RIBBONS AND METHOD FOR MAKING SAME; U.S. patent application Ser. No. 09/915,173, filed on Jul. 25, 2001, now U.S. Pat. No. 6,643,165, entitled ELECTROMECHANICAL MEMORY HAVING CELL SELECTION CIRCUITRY CONSTRUCTED WITH NANOTUBE TECHNOLOGY; U.S. patent application Ser. No. 10/693,241, filed on Oct. 24, 2003, now U.S. Pat. No. 7,120,047, entitled DEVICE SELECTION CIRCUITRY CONSTRUCTED WITH NANOTUBE TECHNOLOGY; U.S. patent application Ser. No. 09/915,095, filed on Jul. 25, 2001, now U.S. Pat. No. 6,574,130, entitled HYBRID CIRCUIT HAVING NANOTUBE ELECTROMECHANICAL MEMORY; U.S. patent application Ser. No. 10/379,973, filed on Mar. 5, 2003, now U.S. Pat. No. 6,836,424, entitled HYBRID CIRCUIT HAVING NANOTUBE ELECTROMECHANICAL MEMORY; U.S. patent application Ser. No. 10/964,150, filed on Oct. 13, 2004, entitled HYBRID CIRCUIT HAVING NANOTUBE ELECTROMECHANICAL MEMORY; U.S. patent application Ser. No. 10/128,118, filed on Apr. 23, 2002, now U.S. Pat. No. 6,706,402, entitled NANOTUBE FILMS AND ARTICLES; U.S. patent application Ser. No. 10/774,682, filed on Feb. 9, 2004, entitled NANOTUBE FILMS AND ARTICLES; U.S. patent application Ser. No. 10/776,573, filed on Feb. 11, 2004, now U.S. Pat. No. 6,942,921, entitled NANOTUBE FILMS AND ARTICLES; U.S. patent application Ser. No. 11/111,582, filed on Apr. 21, 2005, entitled NANOTUBE FILMS AND ARTICLES. It is preferable to remove the photoresist before the RIE step; however, the photoresist can also be removed after patterning structure 350. Some of the GaN film 320 may be removed or damaged as a result of this step (not shown); however, this only occurs in the non-active region and will not affect the performance of the final structure Step 6: FIG. 3F (3005) depicts a second patterning step by using photoresist 370', which is patterned on the metal pad 340. This photoresist pattern is used to define the metal bond pad that will make contact to appropriate electrical interconnects (not shown).

Figure 3G:
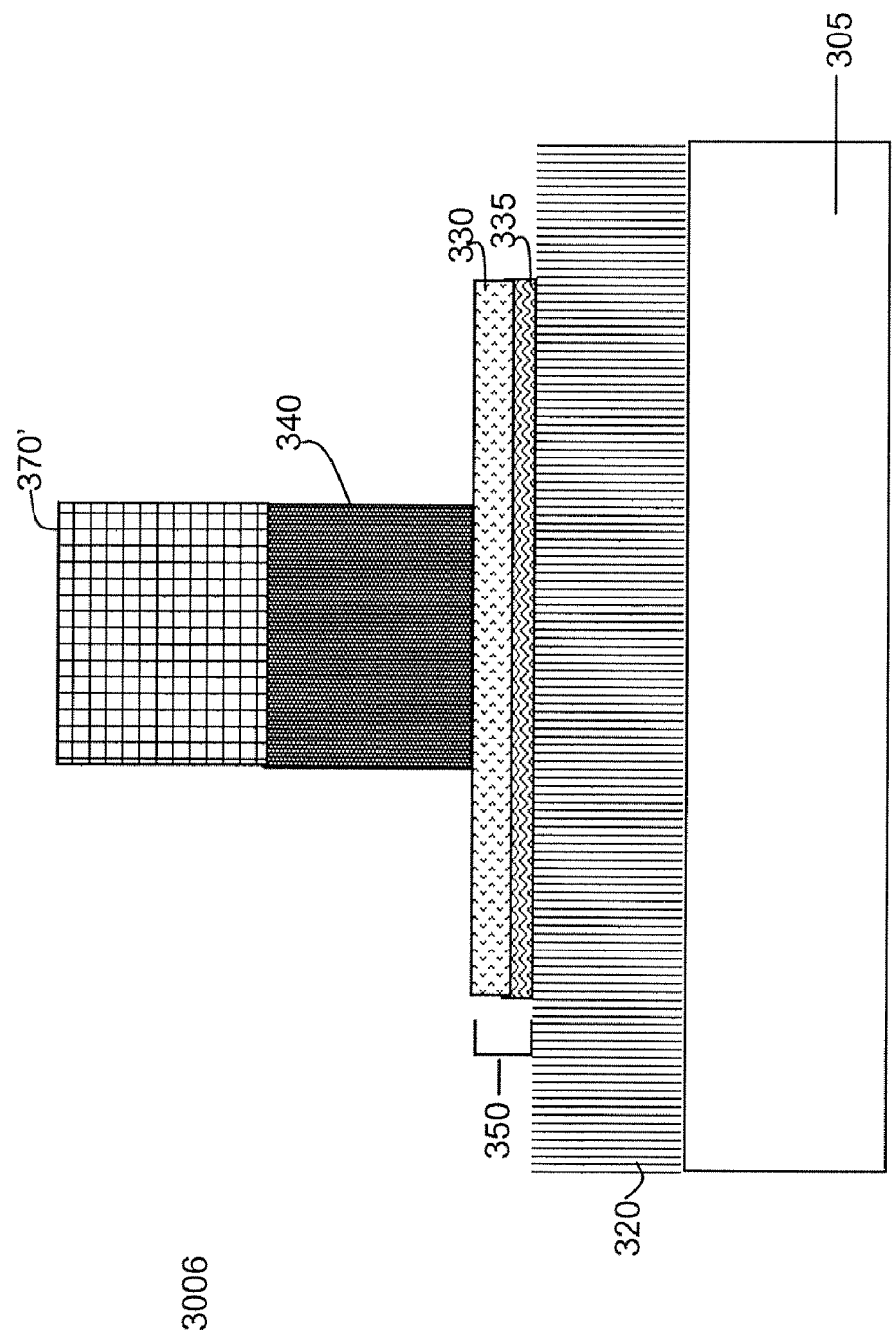

Step 7: In FIG. 3G (3006), the photoresist pattern 370' is transferred to the metal pad 340 by wet etch or RIE. RIE should only be used if the uppermost film 330 of the interface layer 350 is metal of sufficient thickness (>10 nm depending on continuity of thin film) so as to protect the CNTs from plasma damage.

Figure 3H:
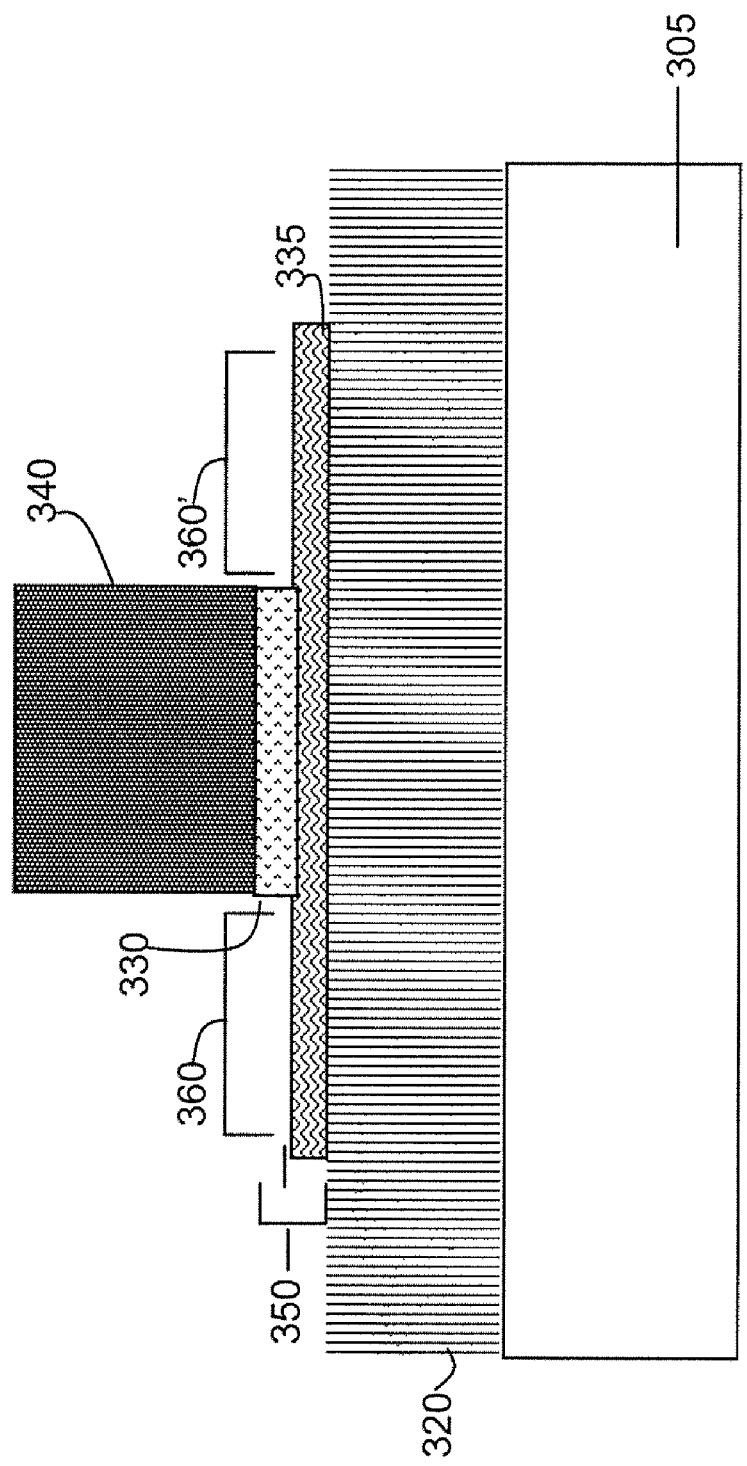

Step 8: FIG. 3H shows the final structure 3007 with a preferred embodiment optional step in which the metal 330 of the interface film 350 may be wet etched, leaving only the CNTs fabric 335 in the region adjacent to the metal pad 340. This step can be implemented to maximize transparency in the active region adjacent to the pad.

The main goal of metal 330 is to provide a low resistance contact between bond pad metal 340 and CNT fabric 335. Most metals form a Schottky barrier contact to CNTs; however, some metals such as Ti and Pd form a nearly ohmic contact to a CNT fabric, which is ideal for this invention. Therefore, the main purpose of metal 330 is to provide an low resistance contact to CNT fabric 335 and to provide an additional ohmic contact to metal bond pad 340. Ideally, the metal film 330 should be removed from the active region (360 and 360' of FIG. 3H) above the CNT fabric 335. If the metal 330 is not removed, ultra-thin films (<10 nm) of metal 330 should be employed so that optical transmission is not degraded. In certain embodiments, such a thin layer (e.g. Pt) that is normally non-conductive, may be used to improve the resistance of the CNT fabric.

Figure 4:
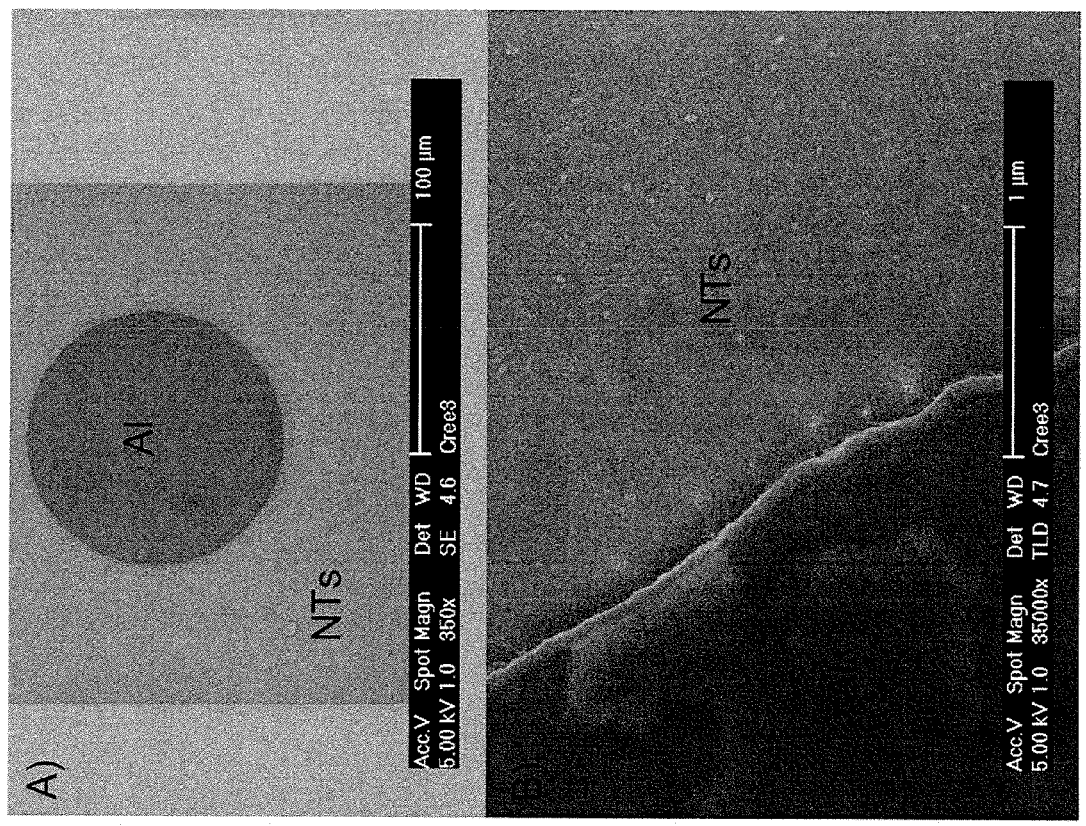
FIG. 4A show a top-down SEM micrographs of a finished contact to GaN comprised of Al and CNTs as the interface film and FIG. 4B show a high magnification SEM micrographs of a finished contact to GaN comprised of Al and CNTs as the interface film.

FIGS. 4A and 4B show FESEM images of a completed GaN device fabricated using the above process flow. FIG. 4A shows the aluminum pad (dark disk) on the active CNT area (square). FIG. 4B shows a high magnification image of the edge of the aluminum pad and the CNTs adjacent to it.

Example 1

This device was made using GaN wafers obtained from CREE, Inc., consisting of a p-GaN/n-GaN heterojunction on a SiC substrate and a protective oxide layer. The backside of the wafer was coated with Shipley 1805 photoresist to protect the backside of the wafer during the stripping of the oxide. The wafer was then immersed in a buffered oxide etch to strip the oxide exposing a clean p-GaN surface.

CNTs were then spun onto the wafer repeatedly until the resistance as measured by a 4-point-probe was about 100Ω. The wafer was then annealed in vacuum at 300° C. for 30 minutes in order to promote adhesion of the CNT fabric and remove residual solvent.

A metal bi-layer film of 4 nm of Ti and 150 nm of Al were then deposited on top of the CNT fabric by electron beam evaporation. In this case, the CNTs and the 4 nm of Ti comprise the interface layer 350 mentioned in FIG. 3, while the 150 nm of Al comprise the contact pad layer 340.

Shipley 1805 positive photoresist was then spun onto the Al film. The resist was then exposed and developed in MicroChem MF-321 developer (a Tetra-methyl-ammonium-hydroxide solution). A secondary advantage of the TMAH developer is that it also etches Al; therefore, the developer was also allowed to etch the aluminum such that the resist pattern transferred to the aluminum during the same step. The wafer was rinsed in DI water and dried.

The photoresist was stripped in Shipley 1165 (1-methyl-2-pyrrolidinone or NMP) at a temperature of 80° C. The wafer was then rinsed in isopropyl alcohol and dried to neutralize and remove residual NMP.

The wafer was then etched in RIE for 2 min in oxygen plasma at 200 W. After the etch process, the wafer was measured in the 4-point-probe, yielding an infinite resistance and indicating that the regions between the contacts are electrically nullified.

The wafer was then spun with Shipley 1805 photoresist and patterned by exposing and developing as above. This process matches FIG. 3F. Similar to above, the photoresist was developed in MF-321 developer and the aluminum was allowed to etch resulting in the structure shown in FIG. 3G. The wafer was rinsed in DI and dried.

Without stripping the photoresist, the wafer was then immersed in an HCl-based Ti etchant for 25 sec in order to remove the 4 nm of Ti in the active region adjacent to the pad (360 and 360' in FIG. 3H). The wafer was rinsed in DI and dried.

The photoresist was finally stripped in NMP, rinsed in IPA and dried. FIGS. 4A-B shows FESEM micrographs of the final structure.

Figure 5:
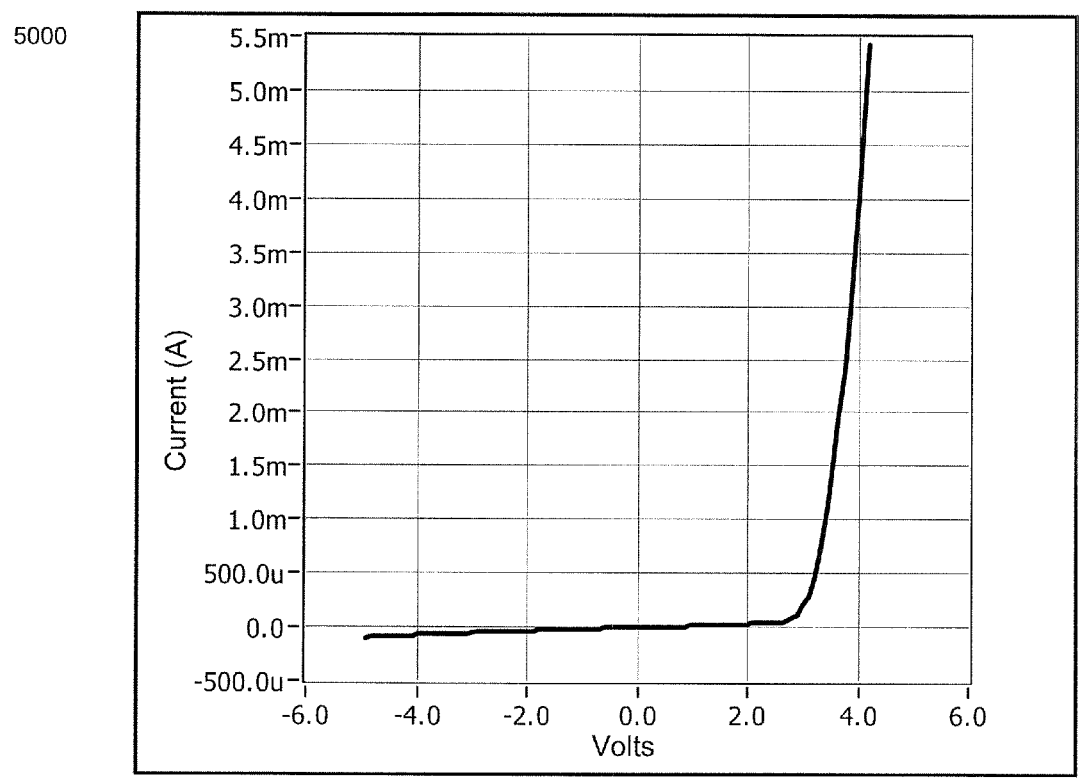
FIG. 5 shows an I-V trace of the device similar to the one imaged in FIG. 4, depicting the diode behavior of the contacted GaN device.
Figure 6:
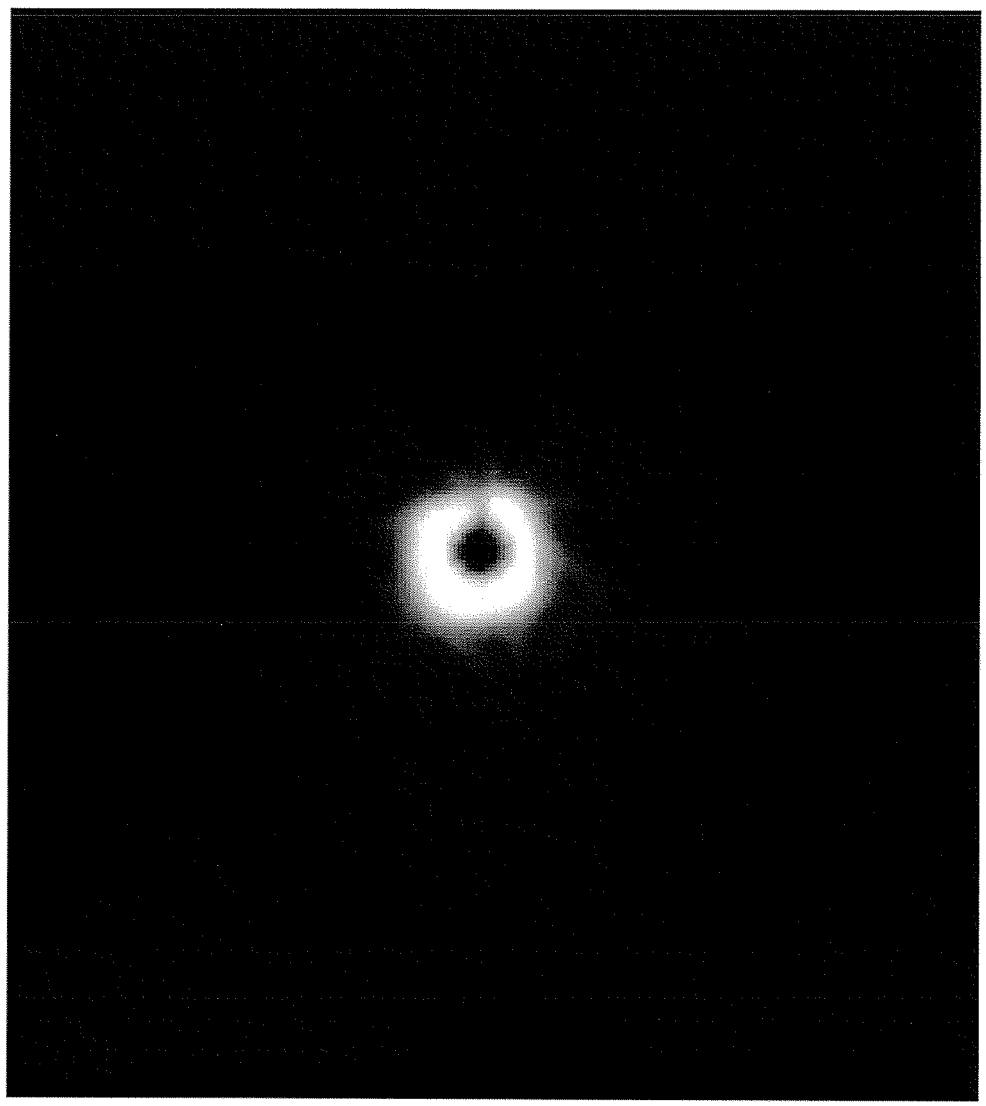
FIG. 6 is a top-down optical image showing light emission from a device resembled in FIG. 4.

This structure was electrically tested, providing the Current-Voltage (I-V) curve shown in FIG. 5. The aluminum pad of a device was wire-bonded with an aluminum wire. Contact was also made to the bottom of the substrate on which gold traces were located; thereby, making contact to the n-doped side of the junction. The voltage bias was applied between the pad and the substrate to produce this curve. Visible light emission was observed at the onset of the ON-current of the diode at approximately 3 V. A top-down optical image of the device during operation is shown in FIG. 6. In this figure, light is emitting from the square region which is the active area contacted by CNTs. The shadowed dot in the center is the aluminum pad. One can also notice the shadow of the aluminum bond wire to the right of the pad.

Figure 7:
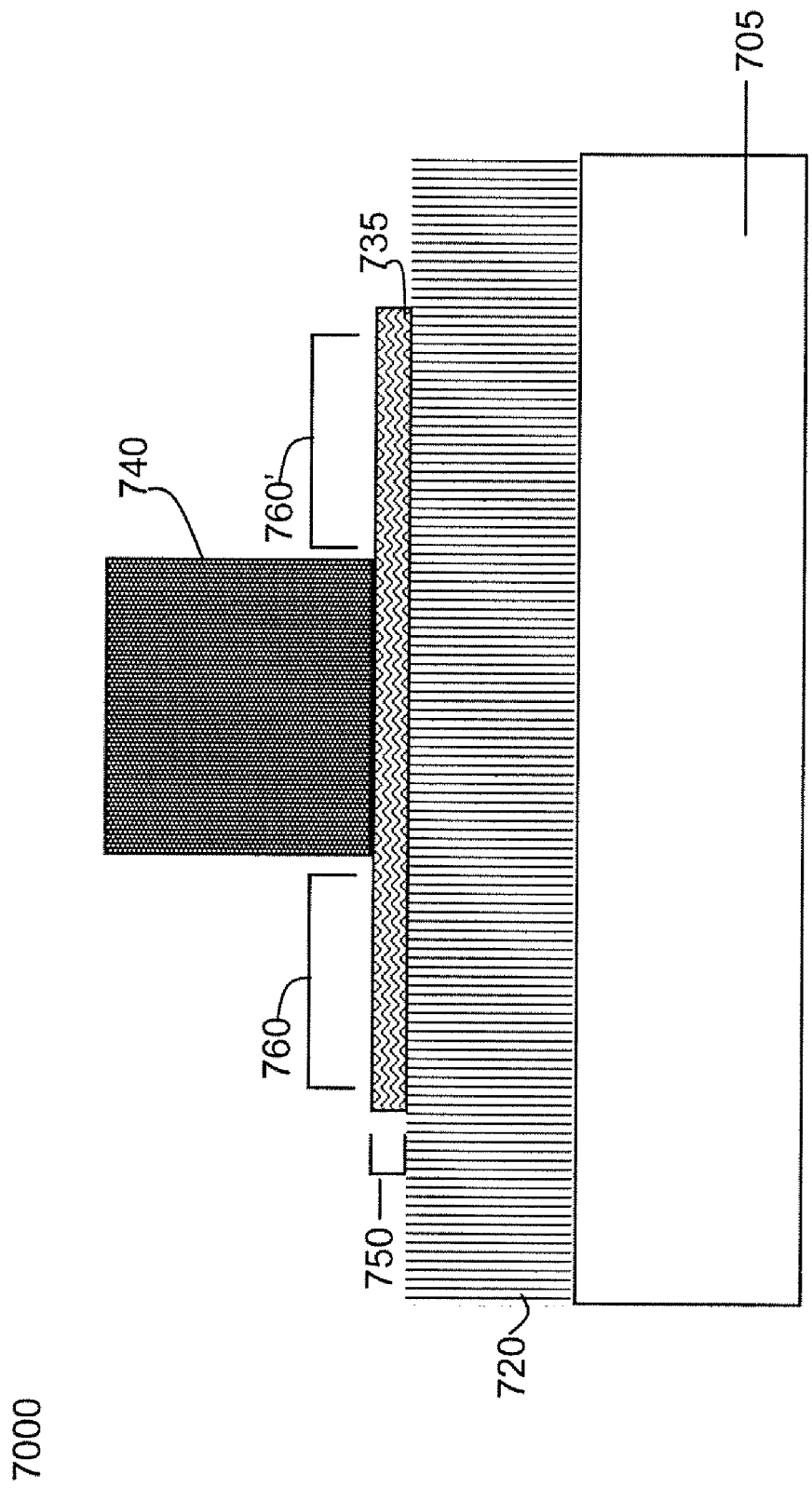
FIG. 7 shows another embodiment of this invention with only a single metal contact.

In another embodiment of this invention, only a single metal is employed for contact to the CNT fabric and as the bond pad metal, structure 7000 in FIG. 7. For this case the bond pad metal 740 forms a low resistance contact to the CNT fabric 735 and will connect to outside electrical connections (not shown). P-GaN film 720, interface layer 750, active areas 760, 760' and substrate 705 are selected and constructed as in other embodiments.

Example 2

The following is an example of a process sequence used to form CNT contacts to p-GaN with aluminum contacting the CNT pad. This particular embodiment of the invention should be considered illustrative and not restrictive.

The substrates used in the experiment described in this example were films p-GaN on sapphire (alumina) substrates which had gold contacts on the bottom side of the wafer and came with a protective sputtered $SiO_2$ layer on the p-GaN layer to protect the film from corrosion, oxidation and damage. The samples were obtained from CREE Inc.

The following process steps were employed:
(a) Strip pGaN sputtered SiO2 with ammonium fluoride: A solution called Timetech® (ammonium fluoride) was used at room temperature to dissolve the 200 nm thick protective film of sputtered $SiO_2$.
(b) Deposit CNTs (spray): With the wafer held at 120 C on a hotplate, an aqueous solution of carbon nanotubes was sprayed onto the substrate until the CNT transparency reached about 90% and the CNT resistance reached about 1000 ohms/square.
(c) Deposit 8/200 nm Ti/Al: The sample was loaded into an E-beam evaporator for metal deposition. A blanket layer of 8 nm Ti and 200 nm Aluminum was deposited. The Ti was used to improve adhesion to the substrate.
(d) Pattern photoresist to define a CNT area (square) and wet etch Al using TMAH: A 250 um square region of photoresist was patterned on the Al layer. The TMAH used to develop the resist was also allowed to etch away the Al film in the exposed areas. The Ti adhesion layer comes into play here by prevent the TMAH to undercut into the CNT fabric.
(e) Strip PR using NMP: NMP solvent at 80 C was used to strip the photoresist.
(f) RIE through Ti/CNTs to render electrically inactive (Al is the hardmask): A reactive ion etch step is used to etch away the CNTs in the areas not protected by the Al. The parameters used: 60 Watts, 25 sccm flow of O2, 20 mT pressure, 60 sec time.
(g) Pattern photoresist to define the metal pad wet etch Al using TMAH: A second photo patterning step is done to define a 100 nm diameter circular pad centered within the square region of metal. As done earlier, the TMAH developed is allowed to develop the resist and etch the Al.
(h) Strip the Ti using Ti etchant: A Ti chemical etch is used to remove the Ti film that is exposed outside of the circular pad region.
(i) Hot NMP to strip photoresist: NMP solvent at 80 C is used to strip the photoresist.

The resulting structure is shown in the FIG. 8 in which one can see the circular Al pad (801), the square CNT region (802) and the surface of the substrate. Once these structures were created, they were used to measure the electrical current-voltage characteristic of the contact to the p-GaN as well as characterization of the light output of the device. FIG. 9 shows microscope images of the light output from several such devices. FIG. 10 shows a current voltage characteristic of the CNT-contacted p-GaN device. The pathway of electric current is from the carbon-nanotube contact, down through the p-n junction and out through the lower contact of the substrate.

Alternate Embodiments

In another embodiment of this invention, a sacrificial material such as, but not limited to, alumina, Ge or a bi-layer alumina/Ge thin film is used to pattern the active region of the CNT fabric. Therefore, after patterning film 330 and CNT fabric 335 (FIG. 3E) a wet etch is performed to remove thin film 330, leaving only the CNT fabric 335. A second thin film 340 would then be deposited and patterned to make electrical contact to the CNT fabric.

Another embodiment of this invention is that the CNT fabric layers may be a monolayer or multilayer fabric, which is deposited by means of spin-coating or spray-coating. The CNT solution may be aqueous or solvent based. The CNTs may be single-walled (SWNTs), multi-walled (MWNTs), or bundles thereof. The CNTs may be fabricated by any means including: Chemical vapor deposition (CVD), laser ablation technique or electric arc furnace.

In another embodiment of this invention, the patterning and electrical contacting of a CNT fabric on top of a semiconductor material is not limited to p-GaN. Other important Group V, III-V or II-VI substrates that may be of interest include, but are not limited to, diamond, Silicon, GaAs, AlN, AlGaN, GaP, SiC, InP and any combination of the materials Al, N, Ga, In, P, As, etc that would be used to form an optical emitting device.

In another embodiment, an anneal can be performed on the final structure to lower the contact resistance between the bond pad, CNT fabric and p-GaN substrate. This anneal may be a vacuum anneal, a forming gas anneal (4% $H_2$ in $N_2$) or a Rapid Thermal Anneal at various temperatures, depending on the metals used for the bond pad contact.

In yet other embodiments, the application of purified nanotubes is preferable. With regard to application of purified nanotubes, using proper bulk nanotube preparations which contain primarily metallic or semiconducting nanotubes would allow application of a nanotube fabric to a substrate. The application of single-walled, multiwalled or mixtures of such nanotubes can be envisioned with subsequent patterning and etching to generate desired structures.

Certain embodiments involve controlled composition of carbon nanotube fabrics. Specifically, methods may be employed to control the relative amount of metallic and semiconducting nanotubes in the nanofabric to achieve the desired characteristics and make an appropriate contact to the GaN and metal bond pads. In this fashion, the nanofabric may be made to have a higher or lower percentage of metallic nanotubes relative to semiconducting nanotubes. Correspondingly, other properties of the nanofabric (e.g., resistance) will change. Further, in some embodiments it may be preferable to separate metallic nanotubes from semiconducting nanotubes, first applying a semiconducting nanotube layer to make contact to the GaN, followed by a metallic layer to make contact to the metal bond pads.

RELATED APPLICATIONS

This application is related to the following references which are assigned to the assignee of this application and are hereby incorporated by reference in their entireties:

U.S. patent application Ser. No. 09/915,093, filed on Jul. 25, 2001, now U.S. Pat. No. 6,919,592, entitled ELECTROMECHANICAL MEMORY ARRAY USING NANOTUBE RIBBONS AND METHOD FOR MAKING SAME;

U.S. patent application Ser. No. 10/850,100, filed on May 20, 2004, now U.S. Pat. No. 7,056,758, entitled ELECTROMECHANICAL MEMORY ARRAY USING NANOTUBE RIBBONS AND METHOD FOR MAKING SAME;

U.S. patent application Ser. No. 10/852,880, filed on May 25, 2004, entitled ELECTROMECHANICAL MEMORY ARRAY USING NANOTUBE RIBBONS AND METHOD FOR MAKING SAME;

U.S. patent application Ser. No. 09/915,173, filed on Jul. 25, 2001, now U.S. Pat. No. 6,643,165, entitled ELECTROMECHANICAL MEMORY HAVING CELL SELECTION CIRCUITRY CONSTRUCTED WITH NANOTUBE TECHNOLOGY;

U.S. patent application Ser. No. 10/693,241, filed on Oct. 24, 2003, now U.S. Pat. No. 7,120,047, entitled DEVICE SELECTION CIRCUITRY CONSTRUCTED WITH NANOTUBE TECHNOLOGY;

U.S. patent application Ser. No. 09/915,095, filed on Jul. 25, 2001, now U.S. Pat. No. 6,574,130, entitled HYBRID CIRCUIT HAVING NANOTUBE ELECTROMECHANICAL MEMORY;

U.S. patent application Ser. No. 10/379,973, filed on Mar. 5, 2003, now U.S. Pat. No. 6,836,424, entitled HYBRID CIRCUIT HAVING NANOTUBE ELECTROMECHANICAL MEMORY;

U.S. patent application Ser. No. 10/964,150, filed on Oct. 13, 2004, entitled HYBRID CIRCUIT HAVING NANOTUBE ELECTROMECHANICAL MEMORY;

U.S. patent application Ser. No. 10/033,323, filed on Dec. 28, 2001, now U.S. Pat. No. 6,911,682, entitled ELECTROMECHANICAL THREE-TRACE JUNCTION DEVICES;

U.S. patent application Ser. No. 10/802,900, filed on Mar. 17, 2004, entitled ELECTROMECHANICAL THREE-TRACE JUNCTION DEVICES;

U.S. patent application Ser. No. 10/033,032, filed on Dec. 28, 2001, now U.S. Pat. No. 6,784,028, entitled METHODS OF MAKING ELECTROMECHANICAL THREE-TRACE JUNCTION DEVICES;

U.S. patent application Ser. No. 10/824,679, filed on Apr. 15, 2004, now U.S. Pat. No. 6,979,590, entitled METHODS OF MAKING ELECTROMECHANICAL THREE-TRACE JUNCTION DEVICES;

U.S. patent application Ser. No. 11/188,678, filed on Jul. 25, 2005, entitled METHODS OF MAKING ELECTROMECHANICAL THREE-TRACE JUNCTION DEVICES;

U.S. patent application Ser. No. 10/128,118, filed on Apr. 23, 2002, now U.S. Pat. No. 6,706,402, entitled NANOTUBE FILMS AND ARTICLES;

U.S. patent application Ser. No. 10/774,682, filed on Feb. 9, 2004, entitled NANOTUBE FILMS AND ARTICLES;

U.S. patent application Ser. No. 10/776,573, filed on Feb. 11, 2004, now U.S. Pat. No. 6,942,921, entitled NANOTUBE FILMS AND ARTICLES;

U.S. patent application Ser. No. 11/111,582, filed on Apr. 21, 2005, entitled NANOTUBE FILMS AND ARTICLES;

U.S. patent application Ser. No. 10/128,117, filed on Apr. 23, 2002, now U.S. Pat. No. 6,835,591, entitled METHODS OF NANOTUBE FILMS AND ARTICLES;

U.S. patent application Ser. No. 11/007,752, filed on Dec. 8, 2004, entitled METHODS OF NANOTUBE FILMS AND ARTICLES;

U.S. patent application Ser. No. 11/010,491, filed on Dec. 13, 2004, entitled METHODS OF NANOTUBE FILMS AND ARTICLES;

U.S. patent application Ser. No. 10/776,059, filed on Feb. 11, 2004, entitled METHODS OF USING PRE-FORMED NANOTUBES TO MAKE CARBON NANOTUBE FILMS, LAYERS, FABRICS, RIBBONS, ELEMENTS AND ARTICLES (HORIZONTAL), now U.S. Patent Publication 2004/0181630;

U.S. patent application Ser. No. 11/193,795, filed on Jul. 29, 2005, entitled METHODS OF USING PRE-FORMED NANOTUBES TO MAKE CARBON NANOTUBE FILMS, LAYERS, FABRICS, RIBBONS, ELEMENTS AND ARTICLES (HORIZONTAL);

U.S. patent application Ser. No. 10/341,005, filed on Jan. 13, 2003, entitled METHODS OF MAKING CARBON NANOTUBE FILMS, LAYERS, FABRICS, RIBBONS, ELEMENTS AND ARTICLES; and, U.S. patent application Ser. No. 10/341,130, filed on Jan. 13, 2003, entitled CARBON NANOTUBE FILMS, LAYERS, FABRICS, RIBBONS, ELEMENTS AND ARTICLES.

The invention may be embodied in other specific forms without departing from the spirit or essential characteristics thereof. The present embodiments are therefore to be considered in respects as illustrative and not restrictive.

What is claimed is:

1. A conductive article comprising:
   a semiconductor material substrate;
   a patterned conductive trace disposed on the semiconductor material substrate wherein the trace includes:
      a non-woven nanotube fabric layer comprising a plurality of unaligned nanotubes providing a plurality of conductive pathways along the extent of the trace, and
      a metal layer adjacent to the non-woven nanotube fabric layer.

2. The conductive article of claim 1 wherein the metal layer is a thin film disposed on the non-woven nanotube fabric layer and wherein the metal layer is of generally planar extension and substantially parallel to the major surface of the semiconductor.

3. The conductive article of claim 2 further comprising a metal electrode disposed over and in electrical communication with the metal layer.

4. The conductive article of claim 1 wherein the non-woven nanotube fabric layer is disposed on the metal layer and wherein metal layer is a thin film of generally planar extension and substantially parallel to the major surface of the semiconductor.

5. The conductive article of claim 4, further comprising a metal electrode disposed over and in electrical communication with the non-woven nanotube fabric.

6. The patterned conductive trace of claim 1 further comprising multiple layers of metal and multiple layers of non-woven nanotube fabric, alternately disposed.

7. The patterned conductive trace of claim 6 wherein each layer of metal and each layer of non-woven nanotube fabric is of generally planar extension and substantially parallel to the major surface of the semiconductor.

8. The conductive article of claim 1 wherein at least a portion of the patterned conductive trace includes an active region, the active region constructed and arranged to be substantially optically transparent in at least a portion of the visible light range.

9. The conductive article of claim 8 wherein the metal layer is a thin film of less than 10 nanometers thickness in the dimension substantially perpendicular to the major surface of the semiconductor.

10. The conductive article of claim 1 wherein the semiconductor includes a p-GaN layer and a n-GaN layer disposed in adjacent and substantially parallel layers.

11. The conductive article of claim 1 wherein the semiconductor material substrate is selected from a set including Group III-V, V and II-VI semiconductor materials.

12. The conductive article of claim 1 wherein the non-woven nanotube fabric includes single-walled carbon nanotubes and multi-walled carbon nanotubes.

13. The conductive article of claim 1 wherein the non-woven nanotube fabric includes metallic nanotubes and semiconducting nanotubes and wherein the relative composition of metallic and semiconducting nanotubes in the fabric is controlled.

* * * * *